(12) United States Patent
Muramatsu

(10) Patent No.: US 12,301,259 B2
(45) Date of Patent: May 13, 2025

(54) DECODING APPARATUS, DECODING METHOD AND PROGRAM

(71) Applicant: NIPPON TELEGRAPH AND TELEPHONE CORPORATION, Tokyo (JP)

(72) Inventor: Jun Muramatsu, Tokyo (JP)

(73) Assignee: NIPPON TELEGRAPH AND TELEPHONE CORPORATION, Tokyo (JP)

( * ) Notice: Subject to any disclaimer, the term of this patent is extended or adjusted under 35 U.S.C. 154(b) by 0 days.

(21) Appl. No.: 18/258,967

(22) PCT Filed: Jan. 4, 2021

(86) PCT No.: PCT/JP2021/000035
§ 371 (c)(1),
(2) Date: Jun. 22, 2023

(87) PCT Pub. No.: WO2022/145057
PCT Pub. Date: Jul. 7, 2022

(65) Prior Publication Data
US 2024/0056102 A1    Feb. 15, 2024

(51) Int. Cl.
*H03M 13/39* (2006.01)
*H03M 13/13* (2006.01)

(52) U.S. Cl.
CPC ....... *H03M 13/3944* (2013.01); *H03M 13/13* (2013.01)

(58) Field of Classification Search
CPC ................ H03M 13/3944; H03M 13/13

USPC .......................................... 714/752
See application file for complete search history.

(56) References Cited

U.S. PATENT DOCUMENTS

| | | | | |
|---|---|---|---|---|
| 11,063,614 B1* | 7/2021 | Chen | ............ | H03M 13/45 |
| 11,165,445 B2* | 11/2021 | Blankenship | ....... | H03M 13/098 |
| 11,177,834 B2* | 11/2021 | Chaki | ............ | H03M 13/13 |
| 11,405,055 B2* | 8/2022 | Arikan | ............ | H04L 1/0065 |
| 2017/0077954 A1* | 3/2017 | Shen | ............ | H03M 13/13 |
| 2017/0155405 A1* | 6/2017 | Ge | ............ | H04L 1/0061 |
| 2018/0351581 A1* | 12/2018 | Presman | ......... | H03M 13/3746 |
| 2019/0052418 A1* | 2/2019 | Li | ............ | H04L 1/1819 |
| 2020/0021309 A1* | 1/2020 | Xu | ............ | H04L 1/1816 |
| 2020/0028524 A1* | 1/2020 | Huang | ............ | H03M 13/13 |
| 2020/0067638 A1* | 2/2020 | Zhou | ............ | H03M 13/13 |
| 2021/0399747 A1* | 12/2021 | Feng | ............ | H03M 13/2906 |

OTHER PUBLICATIONS

E. Arikan, "Channel polarization:a method for constructing capacity-achieving codes for symmetric binary-input memoryless channels,", IEEE Trans. Inform. Theory, vol. IT-55, No. 7, pp. 1-23, Jul. 2009.*

(Continued)

*Primary Examiner* — Albert Decady
*Assistant Examiner* — Osman M Alshack
(74) *Attorney, Agent, or Firm* — IPUSA, PLLC

(57) ABSTRACT

A decoding device includes a memory and a processor configured to execute inputting a code word encoded by a polar code from an original message; decoding the original message from the code word based on a conditional probability expressed by a symmetric parameterization and having observation information as a condition; and outputting the decoded original message.

9 Claims, 33 Drawing Sheets

(56) References Cited

OTHER PUBLICATIONS

I. Tal, A. Vardy, "List decoding of polar codes," IEEE Transactions on Information Theory, vol. 61, No. 5, May 2015.
E.Arikan, et al. "Source polarization," Proc. 2010IEEE International Symposium on Information Theory, 2010, pp. 899-903.
E. Arikan, "Systematic polar coding,", IEEE Communications Letters, vol. 15, No. 8, pp. 860-862, Aug. 2011.
M. Blum, R. W. Floyd, V. Pratt, R. L. Rivest, and R. E. Tarjan, "Time bounds for selection,", J. Computer and System Sciences, vol. 7, No. 4, pp. 448-461, 1973.
R. Mori and T. Tanaka, "Source and channel polarization over finite fields and Reed-Solomon matrices,", IEEE Trans. Inform. Theory, vol. IT-60, No. 5, pp. 1-17, Feb. 2014.
J. Muramatsu, "Successive-cancellation decoding of linear source code,", Proceedings of the 2019 IEEE Information Theory Workshop, Visby, Sweden, Aug. 25-28, 2019. Extended version available at arXiv: 1903.11787 [cs.IT], 2019.
E. S, as,oglu, "Polarization and polar codes,", Fund. Trends Commun. Inf. Theory, vol. 8, No. 4, pp. 259-381, Oct. 2012.
I. Tal and A. Vardy, "How to construct polar codes,", IEEE Trans. Inform. Theory, vol. IT-59, No. 10, pp. 1-21, Apr. 2013.

\* cited by examiner

Fig. 5

Algorithm 1 Successive-cancellation decoder

Input: $\mathcal{I}_1, u_{\mathcal{I}_1}^{(n)}, \left\{P_{U_{b^n}^{(o)}}\right\}_{b^n \in [0^n:1^n]}$ 1: for $b^n \in [0^n:1^n]$ do $\Theta[0][b^n] \leftarrow P_{U_{b^n}^{(o)}}(0) - P_{U_{b^n}^{(o)}}(1)$
2: for $b^n \in [0^n:1^n]$ do
3:     update$\Theta(\Theta, U, n, b^n)$
4:     if $b^n \in \mathcal{I}_1$ then
5:         $U[n][c^0][b_{n-1}] \leftarrow u_{b^n}^{(n)}$
6:     else
7:         $U[n][c^0][b_{n-1}] \leftarrow \begin{cases} 0 & \text{if } \Theta[n][0] > 0 \\ 1 & \text{if } \Theta[n][0] < 0 \\ 0 \text{ or } 1 & \text{if } \Theta[n][0] = 0 \end{cases}$
8:     end if
9:     if $b_{n-1} = 1$ then updateU$(U, n, b^{n-1})$
10: end for

Fig. 6

Algorithm 2 updateθ(θ, U, k, $b^k$)

1: if $k = 0$ then return
2: if $b_{k-1} = 0$ then updateθ(θ, U, k − 1, $b^{k-1}$)
3: for $c^{n-k} \in [0^{n-k} : 1^{n-k}]$ do
4:    if $b_{k-1} = 0$ then
5:       $\theta[k][c^{n-k}] \leftarrow \theta[k-1][c^{n-k}1] \cdot \theta[k-1][c^{n-k}0]$
6:    else
7:       $\theta[k][c^{n-k}] \leftarrow \frac{\theta[k-1][c^{n-k}1] \mp_u \theta[k-1][c^{n-k}0]}{1 \mp_u \theta[k][c^{n-k}]}$, where $u = U[k][c^{n-k}][0]$
8:    end if
9: end for

Fig. 7

| Algorithm 3 updateU($U, k, b^{k-1}$) |
|---|
| 1: for $c^{n-k} \in [0^{n-k} : 1^{n-k}]$ do |
| 2: $\quad U[k-1][c^{n-k}0][b_{k-2}] \leftarrow U[k][c^{n-k}][0] \oplus U[k][c^{n-k}][1]$ |
| 3: $\quad U[k-1][c^{n-k}1][b_{k-2}] \leftarrow U[k][c^{n-k}][1]$ |
| 4: end for |
| 5: if $b_{k-2} = 1$ then updateU($U, k-1, b^{k-2}$) |

Fig. 8

Algorithm 4 Successive-cancellation list decoder

Input: $\mathcal{I}_1, u_{\mathcal{I}_1}^{(n)}, \{P_{U_{b^n}^{(0)}}\}_{b^n \in [0^n:1^n]}, L$ 1: $A \leftarrow 1$
2: for $b^n \in [0^n:1^n]$ do $\Theta[0][0][b^n] \leftarrow P_{U_{b^n}^{(0)}}(0) - P_{U_{b^n}^{(0)}}(1)$
3: $P[0] \leftarrow 1$
4: for $b^n \in [0^n:1^n]$ do
5:    for $\lambda \in \{0,\ldots,A-1\}$ do update$\Theta(\Theta[\lambda], U[\lambda], n, b^n)$
6:    if $b^n \in \mathcal{I}_1$ then
7:       extendPath($b^n, A$)
8:    else
9:       if $2 \cdot A \leq L$ then
10:          splitPath($b^n, A$)
11:          $A \leftarrow 2 \cdot A$
12:       else
13:          prunePath($b^n, A$)
14:          $A \leftarrow L$
15:       end if then
16:    end if
17:    magnifyP($A$)
18:    if $b_{n-1} = 1$ then
19:       for $\lambda \in \{0,\ldots,A-1\}$ do updateU($U[\lambda], n, b^{n-1}$)
20:    end if
21: end for

Fig. 9

| Algorithm 5 extendPath($b^n$, A) |
|---|
| 1: for $\lambda \in \{0, ..., A-1\}$ do |
| 2:  $\quad P[\lambda] \leftarrow P[\lambda] \cdot (1 \mp_u \Theta[\lambda][n][b^n])$, where $u = u_{b^n}^{(n)}$ |
| 3:  $\quad U[\lambda][n][c^0][b_{n-1}] \leftarrow u_{b^n}^{(n)}$ |
| 4: end for |

Fig. 10

| Algorithm 6 splitPath($b^n$, $\Lambda$) |
|---|
| 1: for $\lambda \in \{0, \ldots, \Lambda - 1\}$ do |
| 2:     $P[\Lambda + \lambda] \leftarrow P[\lambda] \cdot (1 - \theta[\lambda][n][b^n])$ |
| 3:     $P[\lambda] \leftarrow P[\lambda] \cdot (1 + \theta[\lambda][n][b^n])$ |
| 4:     copyPath($\Lambda + \lambda, \lambda$) |
| 5:     $U[\lambda][n][c^0][b_{n-1}] \leftarrow 0$ |
| 6:     $U[\Lambda + \lambda][n][c^0][b_{n-1}] \leftarrow 1$ |
| 7: end for |

Fig. 11

Algorithm 7 prunePath($b^n, \Lambda$)

1: for $\lambda \in \{0, \ldots, \Lambda - 1\}$ do
2: $\quad P[\Lambda + \lambda] \leftarrow P[\lambda] \cdot (1 - \theta[\lambda][n][b^n])$
3: $\quad P[\lambda] \leftarrow P[\lambda] \cdot (1 + \theta[\lambda][n][b^n])$
4: end for
5: Define $\{\text{Active}[\lambda]\}_{\lambda=0}^{2 \cdot \Lambda - 1}$ so that $\text{Active}[\lambda] = 1$ iff $P[\lambda]$ is one of the $L$ largest values of $\{P[\lambda]\}_{\lambda=0}^{2 \cdot \Lambda - 1}$ (ties are broken arbitrarily).
6: for $\lambda \in \{0, \ldots, \Lambda - 1\}$ do
7: $\quad$ if $\text{Active}[\lambda] = 1$ then
8: $\quad\quad U[\lambda][n][c^0][b_{n-1}] \leftarrow 0$
9: $\quad\quad$ if $\text{Active}[\Lambda + \lambda] = 1$ and $\Lambda + \lambda < L$ then
10: $\quad\quad\quad$ copyPath($\Lambda + \lambda, \lambda$)
11: $\quad\quad\quad U[\Lambda + \lambda][n][c^0][b_{n-1}] \leftarrow 1$
12: $\quad\quad$ end if
13: $\quad$ else if $\text{Active}[\Lambda + \lambda] = 1$ then
14: $\quad\quad P[\lambda] \leftarrow P[\Lambda + \lambda]$
15: $\quad\quad U[\lambda][n][c^0][b_{n-1}] \leftarrow 1$
16: $\quad\quad \text{Active}[\lambda] \leftarrow 1$
17: $\quad\quad \text{Active}[\Lambda + \lambda] \leftarrow 0$
18: $\quad$ end if
19: end for
20: $\lambda' \leftarrow 0$
21: for $\lambda \in \{L, \ldots, 2 \cdot \Lambda - 1\}$ do
22: $\quad$ if $\text{Active}[\lambda] = 1$ then
23: $\quad\quad$ while $\text{Active}[\lambda'] = 1$ do $\lambda' \leftarrow \lambda' + 1$
24: $\quad\quad P[\lambda'] \leftarrow P[\lambda]$
25: $\quad\quad$ copyPath($\lambda', \lambda - \Lambda$)
26: $\quad\quad U[\lambda][n][c^0][b_{n-1}] \leftarrow 1$
27: $\quad\quad \lambda' \leftarrow \lambda' + 1$
28: $\quad$ end if
29: end for

Fig. 12

| Algorithm 8 copyPath($\lambda'$, $\lambda$) |
|---|
| 1: for $k \in \{0, \ldots, n\}$ do |
| 2:    for $c^k \in \{0^k, \ldots, 1^k\}$ do |
| 3:       $\theta[\lambda'][k][c^k] \leftarrow \theta[\lambda][k][c^k]$ |
| 4:       for $b \in \{0, 1\}$ do |
| 5:          $U[\lambda'][k][c^k][b] \leftarrow U[\lambda][k][c^k][b]$ |
| 6:       end for |
| 7:    end for |
| 8: end for |

Fig. 13

| Algorithm 9 magnifyP(Λ) |
|---|
| 1: maxP ← 0 |
| 2: for λ ∈ {0, ..., Λ − 1} do |
| 3:    if maxP < P[λ] then maxP ← P[λ] |
| 4: end for |
| 5: for λ ∈ {0, ..., Λ − 1} do P[λ] ← P[λ]/maxP |

Fig. 14

Algorithm 2 update$\Theta(\Theta, U, k, b^k)$

1: if $k = 0$ then return
2: if $b_{k-1} = 0$ then update$\Theta(\Theta, U, k-1, b^{k-1})$
3: for $c^{n-k} \in [0^{n-k} : 1^{n-k}]$ do
4:    if $b_{k-1} = 0$ then
5:       $\Theta[k][c^{n-k}] \leftarrow \Theta[k-1][c^{n-k}1] \cdot \Theta[k-1][c^{n-k}0]$
6:    else
7:       $\Theta[k][c^{n-k}] \leftarrow \Theta[k-1][c^{n-k}1] \mp_u \Theta[k-1][c^{n-k}0]$, where $u \equiv U[k][c^{n-k}][0]$
8:    if $\Theta[k][c^{n-k}] < 0$ then $\Theta[k][c^{n-k}] \leftarrow -1$
9:    if $\Theta[k][c^{n-k}] > 0$ then $\Theta[k][c^{n-k}] \leftarrow 1$
10:    end if
11: end for

Fig. 15

Algorithm 2 update$\Theta(\Theta, U, k, b^k)$

1: if $k = 0$ then return
2: if $b_{k-1} = 0$ then update$\Theta(\Theta, U, k-1, b^{k-1})$
3: for $c^{n-k} \in [0^{n-k} : 1^{n-k}]$ do
4:    if $b_{k-1} = 0$ then
5:       $\Theta_\perp[k][c^{n-k}] \leftarrow \Theta_\perp[k-1][c^{n-k}1] \wedge \Theta_\perp[k-1][c^{n-k}0]$
6:       $\Theta_\perp[k][c^{n-k}] \leftarrow (\Theta_\perp[k-1][c^{n-k}1] \oplus \Theta_\perp[k-1][c^{n-k}0]) \wedge \Theta_\perp[k][c^{n-k}]$
7:    else
8:       $\Theta_\perp[k][c^{n-k}] \leftarrow \Theta_\perp[k-1][c^{n-k}1] \vee \Theta_\perp[k-1][c^{n-k}0]$
9:       $\Theta_\perp[k][c^{n-k}] \leftarrow \Theta_\perp[k-1][c^{n-k}1] \vee (\Theta_\perp[k-1][c^{n-k}0] \oplus U[k][c^{n-k}][0])$
10:    end if
11: end for

Fig. 16

| Algorithm 7-1 markPath($\Lambda$) |
|---|
| 1: for $\lambda \in \{0,\ldots,\Lambda-1\}$ do |
| 2:     Index[$\lambda$] = $\lambda$ |
| 3:     Active[$\lambda$] = 0 |
| 4: end for |
| 5: selectPath(0, $2 \cdot \Lambda - 1$) |
| 6: for $\lambda \in \{0,\ldots,L-1\}$ do Active[Index[$\lambda$]] = 1 |

Fig. 17

| Algorithm 7-2 selectPath(left, right) |
|---|
| 1: if left < right then |
| 2: $\lambda \leftarrow$ partition(left, right) |
| 3: if $\lambda > L$ then selectPath(left, $\lambda - 1$) |
| 4: if $\lambda < L$ then selectPath($\lambda + 1$, right) |
| 5: end if |

Fig. 18

Algorithm 7-3 partition(left, right)

1: Let $\lambda$ be one of the values in $\{\texttt{left},\ldots,\texttt{right}\}$ selected uniformly at random and employ swapIndex($\lambda$, right).
2: $p \leftarrow P[\text{right}]$
3: $\lambda \leftarrow \text{left} - 1$
4: $\lambda' \leftarrow \text{right}$
5: while true do
6: $\quad \lambda \leftarrow \lambda + 1$
7: $\quad \lambda' \leftarrow \lambda' - 1$
8: $\quad$ while $P[\text{Index}[\lambda]] \geq p$ and $\lambda \leq \lambda'$ do $\lambda \leftarrow \lambda + 1$
9: $\quad$ while $P[\text{Index}[\lambda']] < p$ and $\lambda \leq \lambda'$ do $\lambda' \leftarrow \lambda' - 1$
10: $\quad$ if $\lambda \geq \lambda'$ then break
11: $\quad$ swapIndex($\lambda, \lambda'$).
12: end while
13: swapIndex($\lambda$, right)
14: return $\lambda$

Fig. 19

| Algorithm 7-4 swapIndex($\lambda, \lambda'$) |
|---|
| 1: $i \leftarrow \text{Index}[\lambda]$ |
| 2: $\text{Index}[\lambda] \leftarrow \text{Index}[\lambda']$ |
| 3: $\text{Index}[\lambda'] \leftarrow i$ |

Fig. 20

Algorithm 1 Successive-cancellation decoder

Input: $n, \mathcal{I}_1, u_{\mathcal{I}_1}^{(n)}, \{P_{U_{b^n}^{(0)}}\}_{b^n \in [0^n : 1^n]}$ 1: for $b^n \in [0^n : 1^n]$ do $\theta[0][b^n] \leftarrow P_{U_{b^n}^{(0)}}(0) - P_{U_{b^n}^{(0)}}(1)$
2: for $b^n \in [0^n : 1^n]$ do
3: $\quad$ update$\theta(\theta, U, n, b^n)$
4: $\quad$ if $b^n \in \mathcal{I}_1$ then
5: $\quad\quad$ $U[n][c^0][b_{n-1}] \leftarrow u_{b^n}^{(n)}$
6: $\quad$ else
7: $\quad\quad$ $U[n][c^0][b_{n-1}] \leftarrow \begin{cases} 0 & \text{if } \theta[n][0] > 0 \\ 1 & \text{if } \theta[n][0] < 0 \\ 0 \text{ or } 1 & \text{if } \theta[n][0] = 0 \end{cases}$
8: $\quad$ $M[b^n] \leftarrow U[n][c^0][b_{n-1}]$
9: $\quad$ end if
10: $\quad$ if $b_{n-1} = 1$ then updateU$(U, n, b^{n-1})$
11: end for

Fig. 21

| Algorithm 6 splitPath($b^n$, $A$) |
|---|
| 1: for $\lambda \in \{0, \ldots, A-1\}$ do |
| 2:    $P[A + \lambda] \leftarrow P[\lambda] \cdot (1 - \theta[\lambda][n][b^n])$ |
| 3:    $P[\lambda] \leftarrow P[\lambda] \cdot (1 + \theta[\lambda][n][b^n])$ |
| 4:    copyPath($A + \lambda, \lambda$) |
| 5:    $U[\lambda][n][c^0][b_{n-1}] \leftarrow 0$ |
| 6:    $M[\lambda][b^n] \leftarrow 0$ |
| 7:    $U[A + \lambda][n][c^0][b_{n-1}] \leftarrow 1$ |
| 8:    $M[A + \lambda][b^n] \leftarrow 1$ |
| 9: end for |

Fig. 22

---
Algorithm 7 prunePath($b^n, \Lambda$)
---

1: for $\lambda \in \{0, \ldots, \Lambda - 1\}$ do
2:     $P[\Lambda + \lambda] \leftarrow P[\lambda] \cdot (1 - \theta[\lambda][n][b^n])$
3:     $P[\lambda] \leftarrow P[\lambda] \cdot (1 + \theta[\lambda][n][b^n])$
4: end for
5: Define $\{\text{Active}[\lambda]\}_{\lambda=0}^{2\cdot\Lambda-1}$ so that $\text{Active}[\lambda] = 1$ iff $P[\lambda]$ is one of the $L$ largest values of $\{P[\lambda]\}_{\lambda=0}^{2\cdot\Lambda-1}$ (ties are broken arbitrarily).
6: for $\lambda \in \{0, \ldots, \Lambda - 1\}$ do
7:     if $\text{Active}[\lambda] = 1$ then
8:        $U[\lambda][n][c^0][b_{n-1}] \leftarrow 0$
9:        $M[\lambda][b^n] \leftarrow 0$
10:        if $\text{Active}[\Lambda + \lambda] = 1$ and $\Lambda + \lambda < L$ then
11:           copyPath$(\Lambda + \lambda, \lambda)$
12:           $U[\Lambda + \lambda][n][c^0][b_{n-1}] \leftarrow 1$
13:           $M[\Lambda + \lambda][b^n] \leftarrow 1$
14:        end if
15:     else if $\text{Active}[\Lambda + \lambda] = 1$ then
16:        $P[\lambda] \leftarrow P[\Lambda + \lambda]$
17:        $U[\lambda][n][c^0][b_{n-1}] \leftarrow 1$
18:        $M[\lambda][b^n] \leftarrow 1$
19:        $\text{Active}[\lambda] \leftarrow 1$
20:        $\text{Active}[\Lambda + \lambda] \leftarrow 0$
21:     end if
22: end for
23: $\lambda' \leftarrow 0$
24: for $\lambda \in \{L, \ldots, 2 \cdot \Lambda - 1\}$ do
25:     if $\text{Active}[\lambda] = 1$ then
26:        while $\text{Active}[\lambda'] = 1$ do $\lambda' \leftarrow \lambda' + 1$
27:        $P[\lambda'] \leftarrow P[\lambda]$
28:        copyPath$(\lambda', \lambda - \Lambda)$
29:        $U[\lambda][n][c^0][b_{n-1}] \leftarrow 1$
30:        $M[\lambda][b^n] \leftarrow 1$
31:        $\lambda' \leftarrow \lambda' + 1$
32:     end if
33: end for

Algorithm 4 Successive-cancellation list decoder

Input: $n$, $\mathcal{I}_1$, $u^{(n)}_{\mathcal{I}_1}$, $\left\{P_{U^{(0)}_{b^n}}\right\}_{b^n \in [0^n:1^n]}$, $L$ 1: $\Lambda \leftarrow 1$
2: for $b^n \in [0^n : 1^n]$ do $\Theta[0][0][b^n] \leftarrow P_{U^{(0)}_{b^n}}(0) - P_{U^{(0)}_{b^n}}(1)$
3: $P[0] \leftarrow 1$
4: for $b^n \in [0^n : 1^n]$ do
5:    if $b^n \notin \mathcal{I}_1$ then
6:       $s^n \leftarrow b^n$
7:       break
8:    end if
9:    for $\lambda \in \{0, ..., \Lambda - 1\}$ do updateΘ($\Theta[\lambda], U[\lambda], n, b^n$)
10:   for $\lambda \in \{0, ..., \Lambda - 1\}$ do $U[\lambda][n][c^0][b_{n-1}] \leftarrow u^{(n)}_{b^n}$
11:   if $b_{n-1} = 1$ then
12:      for $\lambda \in \{0, ..., \Lambda - 1\}$ do updateU($U[\lambda], n, b^{n-1}$)
13:   end if
14: end for
15: for $b^n \in [s^n : 1^n]$ do
16:   for $\lambda \in \{0, ..., \Lambda - 1\}$ do updateΘ($\Theta[\lambda], U[\lambda], n, b^n$)
17:   if $b^n \in \mathcal{I}_1$ then
18:      extendPath($b^n, \Lambda$)
19:   else
20:      if $2 \cdot \Lambda \leq L$ then
21:         splitPath($b^n, \Lambda$)
22:         $\Lambda \leftarrow 2 \cdot \Lambda$
23:      else
24:         prunePath($b^n, \Lambda$)
25:      end if
26:   end if
27:   magnifyP($\Lambda$)
28:   if $b_{n-1} = 1$ then
29:      for $\lambda \in \{0, ..., \Lambda - 1\}$ do updateU($U[\lambda], n, b^{n-1}$)
30:   end if
31: end for

Fig. 24

Algorithm 7 prunePath($b^n, \Lambda$)

1: for $\lambda \in \{0, \ldots, \Lambda - 1\}$ do
2:     $P[\Lambda + \lambda] \leftarrow P[\lambda] \cdot (1 - \theta[\lambda][n][b^n])$
3:     $P[\lambda] \leftarrow P[\lambda] \cdot (1 + \theta[\lambda][n][b^n])$
4: end for
5: Define $\{\text{Active}[\lambda]\}_{\lambda=0}^{2\cdot\Lambda-1}$ so that $\text{Active}[\lambda] = 1$ iff $P[\lambda]$ is one of the $L$ largest values of $\{P[\lambda]\}_{\lambda=0}^{2\cdot\Lambda-1}$ (ties are broken arbitrarily).
6: for $\lambda \in \{0, \ldots, \Lambda - 1\}$ do
7:     if $\text{Active}[\lambda] = 1$ then
8:         $U[\lambda][n][c^0][b_{n-1}] \leftarrow 0$
9:     else if $\text{Active}[\Lambda + \lambda] = 1$ then
10:         $P[\lambda] \leftarrow P[\Lambda + \lambda]$
11:         $U[\lambda][n][c^0][b_{n-1}] \leftarrow 1$
12:         $\text{Active}[\lambda] \leftarrow 1$
13:         $\text{Active}[\Lambda + \lambda] \leftarrow 0$
14:     end if
15: end for
16: $\lambda' \leftarrow 0$
17: for $\lambda \in \{L, \ldots, 2 \cdot \Lambda - 1\}$ do
18:     if $\text{Active}[\lambda] = 1$ then
19:         while $\text{Active}[\lambda'] = 1$ do $\lambda' \leftarrow \lambda' + 1$
20:         $P[\lambda'] \leftarrow P[\lambda]$
21:         copyPath($\lambda', \lambda - \Lambda$)
22:         $U[\lambda][n][c^0][b_{n-1}] \leftarrow 1$
23:         $\lambda' \leftarrow \lambda' + 1$
24:     end if
25: end for

Algorithm 7 prunePath($b^n, \Lambda$)

1: for $\lambda \in \{0, \ldots, \Lambda - 1\}$ do
2:     $P[\Lambda + \lambda] \leftarrow P[\lambda] \cdot (1 - \theta[\lambda][n][b^n])$
3:     $P[\lambda] \leftarrow P[\lambda] \cdot (1 + \theta[\lambda][n][b^n])$
4: end for
5: Define $\{\text{Active}[\lambda]\}_{\lambda=0}^{2 \cdot \Lambda - 1}$ so that $\text{Active}[\lambda] = 1$ iff $P[\lambda]$ is one of the $L$ largest values of $\{P[\lambda]\}_{\lambda=0}^{2 \cdot \Lambda - 1}$ (ties are broken arbitrarily).
6: for $\lambda \in \{0, \ldots, \Lambda - 1\}$ do
7:     if $\text{Active}[\lambda] = 1$ then
8:         $U[\lambda][n][c^0][b_{n-1}] \leftarrow 0$
9:         $M[\lambda][b^n] \leftarrow 0$
10:     else if $\text{Active}[\Lambda + \lambda] = 1$ then
11:         $P[\lambda] \leftarrow P[\Lambda + \lambda]$
12:         $U[\lambda][n][c^0][b_{n-1}] \leftarrow 1$
13:         $M[\lambda][b^n] \leftarrow 1$
14:         $\text{Active}[\lambda] \leftarrow 1$
15:         $\text{Active}[\Lambda + \lambda] \leftarrow 0$
16:     end if
17: end for
18: $\lambda' \leftarrow 0$
19: for $\lambda \in \{L, \ldots, 2 \cdot \Lambda - 1\}$ do
20:     if $\text{Active}[\lambda] = 1$ then
21:         while $\text{Active}[\lambda'] = 1$ do $\lambda' \leftarrow \lambda' + 1$
22:         $P[\lambda'] \leftarrow P[\lambda]$
23:         copyPath($\lambda', \lambda - \Lambda$)
24:         $U[\lambda][n][c^0][b_{n-1}] \leftarrow 1$
25:         $M[\lambda][b^n] \leftarrow 1$
26:         $\lambda' \leftarrow \lambda' + 1$
27:     end if
28: end for

Fig. 26 if $b_{k-1} = 0$

| | $\Theta[k-1][c^{n-k_0}] = -1$ | $\Theta[k-1][c^{n-k_0}] = 0$ | $\Theta[k-1][c^{n-k_0}] = 1$ |
|---|---|---|---|
| $\Theta[k-1][c^{n-k_1}] = -1$ | 1 | 0 | -1 |
| $\Theta[k-1][c^{n-k_1}] = 0$ | 0 | 0 | 0 |
| $\Theta[k-1][c^{n-k_1}] = 1$ | -1 | 0 | 1 |

Fig. 27 if $b_{k-1} = 1$ and $u[k][c^{n-k}][0] = 0$

| | $\theta[k-1][c^{n-k}][0] = -1$ | $\theta[k-1][c^{n-k}][0] = 0$ | $\theta[k-1][c^{n-k}][0] = 1$ |
|---|---|---|---|
| $\theta[k-1][c^{n-k}_1] = -1$ | $-1$ | $-1$ | ARBITRARY |
| $\theta[k-1][c^{n-k}_1] = 0$ | $-1$ | $0$ | $1$ |
| $\theta[k-1][c^{n-k}_1] = 1$ | ARBITRARY | $1$ | $1$ |

Fig. 28 if $b_{k-1} = 1$ and $U[k][c^{n-k}][0] = 1$

| | $\Theta[k-1][c^{n-k}0] = -1$ | $\Theta[k-1][c^{n-k}0] = 0$ | $\Theta[k-1][c^{n-k}0] = 1$ |
|---|---|---|---|
| $\Theta[k-1][c^{n-k}1] = -1$ | ARBITRARY | $-1$ | $-1$ |
| $\Theta[k-1][c^{n-k}1] = 0$ | $1$ | $0$ | $-1$ |
| $\Theta[k-1][c^{n-k}1] = 1$ | $1$ | $1$ | ARBITRARY |

Fig. 29

| $(\Theta_{-}[k][c^{n-k}], \Theta_1[k][c^{n-k}])$ | $\Theta[k][c^{n-k}] = -1$ | $\Theta[k][c^{n-k}] = 0$ | $\Theta[k][c^{n-k}] = 1$ |
|---|---|---|---|
| | (1,1) | (0,0) | (0,1) |

Fig. 30 if $b_{k-1} = 0$

| | $\theta[k-1][c^{n-k}0] = -1$ | $\theta[k-1][c^{n-k}0] = 0$ | $\theta[k-1][c^{n-k}0] = 1$ |
|---|---|---|---|
| $\theta[k-1][c^{n-k}1] = -1$ | (0,1) | (0,0) | (1,1) |
| $\theta[k-1][c^{n-k}1] = 0$ | (0,0) | (0,0) | (0,0) |
| $\theta[k-1][c^{n-k}1] = 1$ | (1,1) | (0,0) | (0,1) |

Fig. 31 if $b_{k-1} = 1$ and $U[k][c^{n-k}][0] = 0$

| | $\Theta[k-1][c^{n-k}0] = -1$ | $\Theta[k-1][c^{n-k}0] = 0$ | $\Theta[k-1][c^{n-k}0] = 1$ |
|---|---|---|---|
| $\Theta[k-1][c^{n-k}1] = -1$ | (1, 1) | (1, 1) | ARBITRARY |
| $\Theta[k-1][c^{n-k}1] = 0$ | (1, 1) | (0, 0) | (0, 1) |
| $\Theta[k-1][c^{n-k}1] = 1$ | ARBITRARY | (0, 1) | (0, 1) |

Fig. 32 if $b_{k-1} = 1$ and $U[k][c^{n-k}0] = 1$

| | $\theta[k-1][c^{n-k}0] = -1$ | $\theta[k-1][c^{n-k}0] = 0$ | $\theta[k-1][c^{n-k}0] = 1$ |
|---|---|---|---|
| $\theta[k-1][c^{n-k}1] = -1$ | ARBITRARY | (1,1) | (1,1) |
| $\theta[k-1][c^{n-k}1] = 0$ | (0,1) | (0,0) | (1,1) |
| $\theta[k-1][c^{n-k}1] = 1$ | (0,1) | (0,1) | ARBITRARY |

Fig. 33

Algorithm 1 Successive-cancellation decoder

Input: $n$, $\mathcal{I}_1$, $u_{\mathcal{I}_1}^{(n)}$, $\left\{P_{U_{b^n}^{(0)}}\right\}_{b^n \in [0^n:1^n]}$ 1: for $b^n \in [0^n:1^n]$ do $\mathsf{B}[0][b^n] \leftarrow P_{U_{b^n}^{(0)}}(0) - P_{U_{b^n}^{(0)}}(1)$
2: for $b^n \in [0^n:1^n]$ do
3: $\quad$ updateB($\mathsf{B}, \mathsf{U}, n, b^n$)
4: $\quad$ if $b^n \in \mathcal{I}_1$ then
5: $\quad\quad$ $\mathsf{U}[n][c^0][b_{n-1}] \leftarrow u_{b^n}^{(n)}$
6: $\quad$ else
7: $\quad\quad$ $\mathsf{U}[n][c^0][b_{n-1}] \leftarrow \mathsf{B}_-[n][0]$
8: $\quad$ end if
9: $\quad$ if $b_{n-1} = 1$ then updateU($\mathsf{U}, n, b^{n-1}$)
10: end for

DECODING APPARATUS, DECODING METHOD AND PROGRAM

TECHNICAL FIELD

The present invention relates to a technique for decoding information encoded by a polar code.

BACKGROUND ART

The polar code proposed by Arikan is a code that can implement characteristics asymptotically approaching the Shannon limit by using communication channel polarization, and is used for communication channel encoding in 5G, for example.

Further, as a method of decoding a code word encoded by a polar code, there are a successive cancellation decoding method, a successive cancellation list decoding method, and the like. The successive cancellation decoding method is a method of sequentially decoding bits of a message one by one. The successive cancellation list decoding method is a method in which, when the bits are decoded, L sequences (L is a list size) having high likelihood are set as survival paths, and only the most probable sequence is finally output as a decoding result.

CITATION LIST

Non-Patent Literature

Non-Patent Literature 1: I. Tal, A. Vardy, "List decoding of polar codes, "IEEE Transactions on Information Theory, vol. 61, no. 5, May 2015.

Non-Patent Literature 2: E.Arikan, et al. "Source polarization, "Proc. 2010IEEE International Symposium on Information Theory, 2010, pp. 899-903.

SUMMARY OF INVENTION

Technical Problem

As a conventional technique of decoding a polar code, for example, there is a technique disclosed in Non-Patent Literature 1 and the like. However, in the conventional technique disclosed in Non-Patent Literature 1 and the like, there is a problem that the memory amount used in the decoding processing increases. When the used memory amount increases, for example, the calculation amount (calculation time) related to processing, such as copying states of candidates in list decoding, also increases.

The present invention has been made in view of the above points, and an object thereof is to provide a technique capable of reducing the memory amount in decoding of a polar code.

Solution to Problem

According to the disclosed technique, a decoding device is provided that includes: an input unit that inputs a code word encoded by a polar code from an original message; a computation unit that decodes the original message from the code word based on a conditional probability expressed by a symmetric parameterization and having observation information as a condition; and an output unit that outputs the decoded original message.

Advantageous Effects of Invention

According to the disclosed techniques, a technique capable of reducing a memory amount in decoding of a polar code is provided.

BRIEF DESCRIPTION OF DRAWINGS

FIG. 5 is a diagram illustrating Algorithm 1.
FIG. 6 is a diagram illustrating Algorithm 2.
FIG. 7 is a diagram illustrating Algorithm 3.
FIG. 8 is a diagram illustrating Algorithm 4.
FIG. 9 is a diagram illustrating Algorithm 5.
FIG. 10 is a diagram illustrating Algorithm 6.
FIG. 11 is a diagram illustrating Algorithm 7.
FIG. 12 is a diagram illustrating Algorithm 8.
FIG. 13 is a diagram illustrating Algorithm 9.
FIG. 14 is a diagram illustrating Algorithm 2.
FIG. 15 is a diagram illustrating Algorithm 2.
FIG. 16 is a diagram illustrating Algorithm 7-1.
FIG. 17 is a diagram illustrating Algorithm 7-2.
FIG. 18 is a diagram illustrating Algorithm 7-3.
FIG. 19 is a diagram illustrating Algorithm 7-4.
FIG. 20 is a diagram illustrating Algorithm 1.
FIG. 21 is a diagram illustrating Algorithm 6.
FIG. 22 is a diagram illustrating Algorithm 7.
FIG. 23 is a diagram illustrating Algorithm 4.
FIG. 24 is a diagram illustrating Algorithm 7.
FIG. 25 is a diagram illustrating Algorithm 7.
FIG. 26 is a diagram illustrating a table used for application to an erasure channel.
FIG. 27 is a diagram illustrating a table used for application to the erasure channel.
FIG. 28 is a diagram illustrating a table used for application to the erasure channel.
FIG. 29 is a diagram illustrating a table used for application to the erasure channel.
FIG. 30 is a diagram illustrating a table used for application to the erasure channel.
FIG. 31 is a diagram illustrating a table used for application to the erasure channel.
FIG. 32 is a diagram illustrating a table used for application to the erasure channel.
FIG. 33 is a diagram illustrating Algorithm 1.

DESCRIPTION OF EMBODIMENTS

Hereinafter, embodiments of the present invention (present embodiments) will be described with reference to the drawings. The embodiments described below are merely examples, and embodiments to which the present invention is applied are not limited to the following embodiments.

Note that, in the text of the main body of the present description, a hat "^" will be added to the head of characters for convenience of description. "^M" is an example. Furthermore, in the text of the main body of the present specification, in a case where a superscript or a subscript C is used for a subscript B of a certain character A, the subscript B of the character A is not represented by a subscript but is represented by using "_" as in $A\_B_C$.

System Configuration Example

Figure 1:
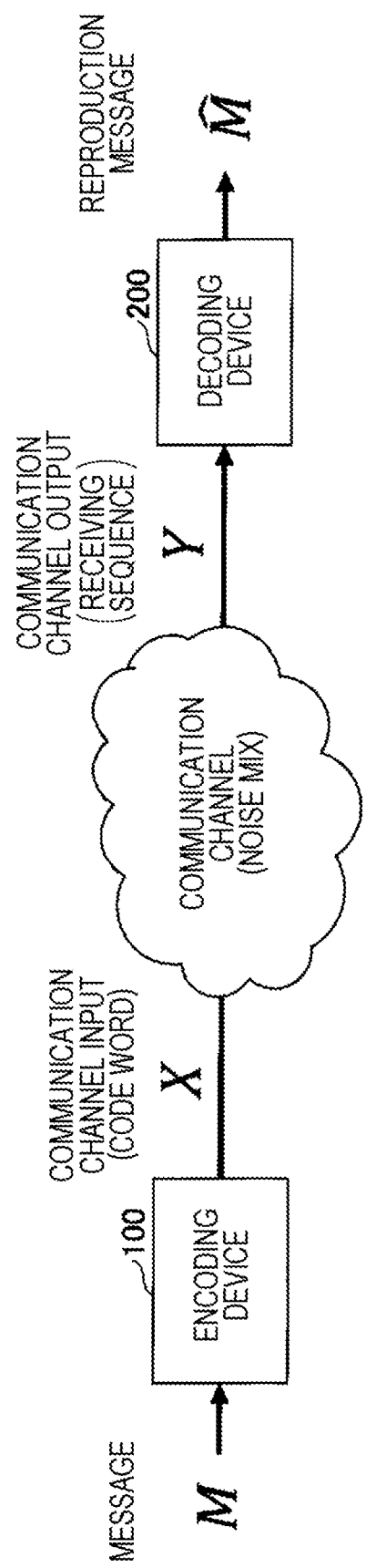
FIG. 1 is a configuration diagram illustrating a communication system according to an embodiment of the present invention.

FIG. 1 illustrates a configuration example of a communication system in the present embodiment. FIG. 1 illustrates an example in which the present invention is applied to a communication channel code (error correction code). As illustrated in FIG. 1, the communication system includes an encoding device 100 and a decoding device 200, which are connected by a communication channel. Note that the encoding device may be referred to as an encoder or the like. The decoding device may be referred to as a decoder or the like.

In the present embodiment, the encoding device 100 encodes an input message M with a polar code, and outputs a code word X as a communication channel input. The decoding device 200 receives Y, which is a communication channel output in which noise is mixed into the code word, performs polar code decoding processing, and outputs a reproduction message ^M. As will be described later, the decoding device 200 performs decoding by a successive cancellation decoding method or a successive cancellation list decoding method. The successive cancellation decoding method is a method of sequentially decoding bits of a message one by one. The successive cancellation list decoding method is a method in which, when the bits are decoded, L sequences (L is a list size) having high likelihood are set as survival paths, and only the maximum likelihood sequence is finally output as a decoding result. The processing (algorithm) of the decoding device 200 will be described in detail later.

Figure 2:
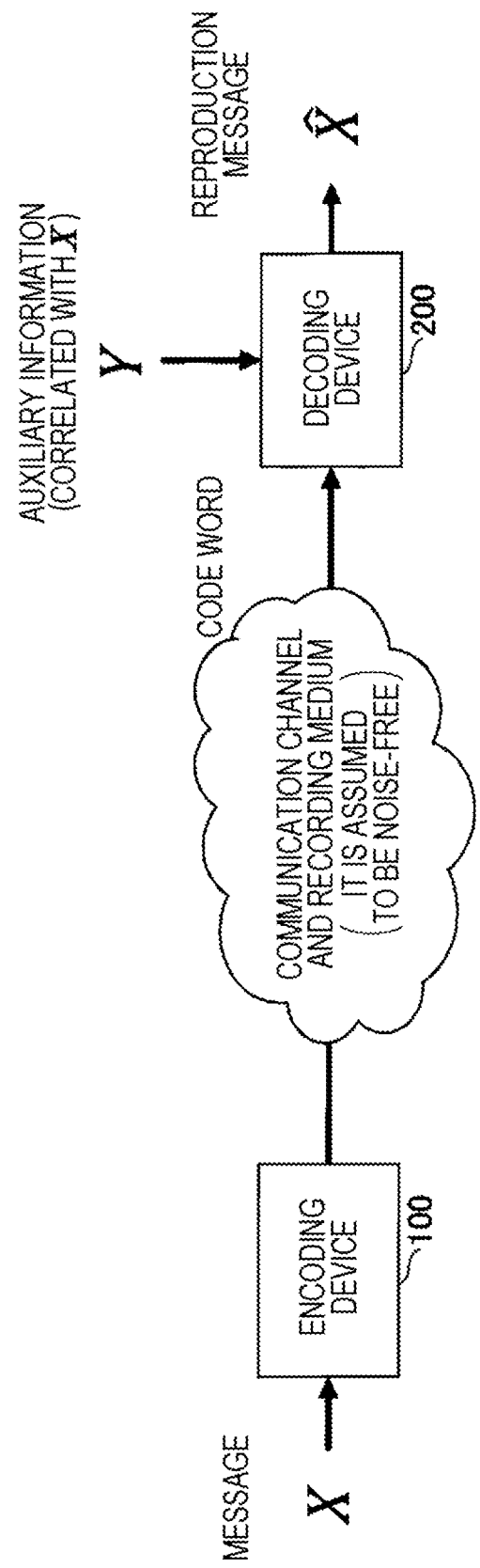
FIG. 2 is a configuration diagram illustrating the communication system according to the embodiment of the present invention.

The decoding algorithm in the present embodiment can uniformly handle decoding of a communication channel code and decoding of an information source code. FIG. 2 is a system configuration diagram in a case where the present invention is applied to an information source code (information compression code).

In the configuration illustrated in FIG. 2, it is assumed that the encoding device 100 and the decoding device 200 are connected by a noise-free communication channel or information is exchanged by a noise-free storage medium. X is input to the encoding device 100 as a message, and a code word is output from the encoding device 100 after being encoded by a polar code. The code word and auxiliary information Y correlated with X are input to the decoding device 100. The decoding device 100 performs polar code decoding processing and outputs a reproduction message ^M. The auxiliary information is, for example, information of a frame preceding a frame to be decoded in a video. Note that the auxiliary information Y may be input to the decoding device 200 from the outside, or may be stored in the decoding device 200 in advance, or a past decoding result may be used as the auxiliary information.

Figure 3:
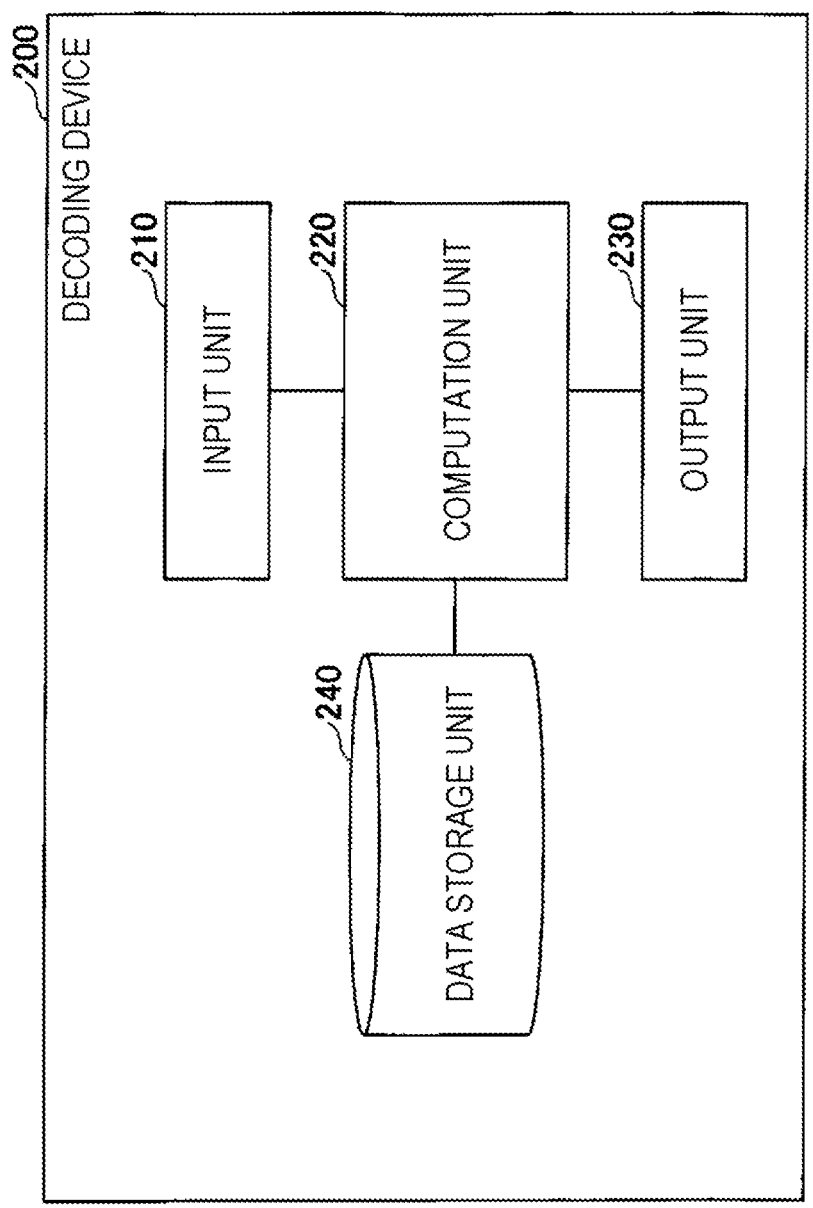
FIG. 3 is a configuration diagram of a decoding device.

FIG. 3 is a functional configuration diagram of the decoding device 200. As illustrated in FIG. 3, the decoding device 200 includes an input unit 210, a computation unit 220, an output unit 230, and a data storage unit 240. The input unit 210 inputs information from a communication channel or a recording medium, or the like. The computation unit 220 executes an algorithm related to the decoding processing. The output unit 230 outputs a computation result (for example, a reproduction message) obtained by the computation unit 220. The data storage unit 240 corresponds to a memory referenced by an algorithm of the decoding processing executed by the computation unit 220. In addition, the data storage unit 240 stores known information and the like used for processing.

In the present embodiment, an "algorithm" may also be called a "processing procedure", a "program", "software", or the like.

Hardware Configuration Example

The decoding device 200 according to the present embodiment can be implemented, for example, by causing a computer to execute a program in which processing contents described in the present embodiment are described. Note that the "computer" may be a physical machine or a virtual machine on a cloud. In a case where a virtual machine is used, "hardware" described herein is virtual hardware.

The above program can be stored and distributed by having it recorded on a computer-readable recording medium (portable memory or the like). Furthermore, the above program can also be provided through a network such as the Internet or e-mail.

Figure 4:
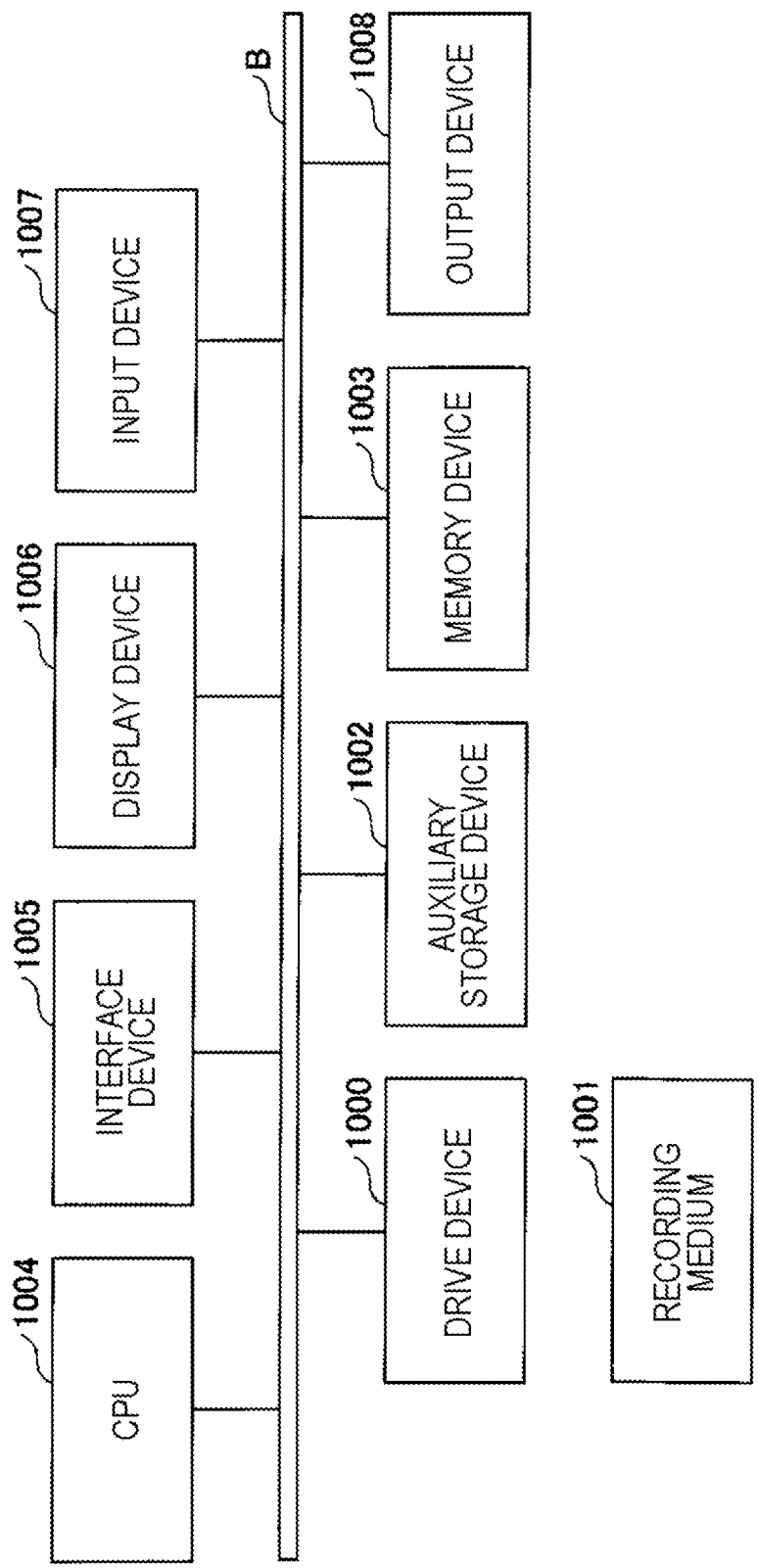
FIG. 4 is a hardware configuration diagram of the decoding device.

FIG. 4 is a diagram illustrating a hardware configuration example of the computer. The computer in FIG. 4 includes a drive device 1000, an auxiliary storage device 1002, a memory device 1003, a CPU 1004, an interface device 1005, a display device 1006, an input device 1007, an output device 1008, and the like which are connected to each other by a bus B.

The program for implementing the processing in the computer is provided by, for example, a recording medium 1001 such as a CD-ROM or a memory card. When the recording medium 1001 storing the program is set in the drive device 1000, the program is installed from the recording medium 1001 to the auxiliary storage device 1002 via the drive device 1000. However, the program is not necessarily installed from the recording medium 1001, and may be downloaded from another computer via a network. The auxiliary storage device 1002 stores the installed program and also stores necessary files, data, and the like.

In a case where an instruction to start the program is made, the memory device 1003 reads and stores the program from the auxiliary storage device 1002. The CPU 1004 implements a function related to the decoding device 200 in accordance with a program stored in the memory device 1003. The interface device 1005 is used as an interface for connecting to the network. The display device 1006 displays a graphical user interface (GUI) or the like by the program. The input device 1007 includes a keyboard and mouse, buttons, a touch panel, or the like, and is used to input various operation instructions. The output device 1008 outputs a computation result. Note that the display device 1006 and the input device 1007 may not be provided.

Hereinafter, algorithms (corresponding to the above program) executed by the decoding device 200 will be described in detail. Hereinafter, first, definitions and basic related techniques will be described, and then each algorithm will be described. In the following description, Reference Literature is indicated as [1], [2], and the like. The names of the Reference Literature are described at the end of the specification. Note that the polar information source code/communication channel code is introduced in Arikan [1], [2], and [3], and Arikan proposes a successive cancellation decoding method that can be implemented with a calculation amount $O(N\log_2 N)$ with respect to a block length N.

In the present embodiment, an algorithm of the successive cancellation decoding method and an algorithm for the successive cancellation list decoding method based on what is introduced in Tal and Vardy [9] will be described. As described above, the technique according to the present embodiment can be applied to both the polar information source code and the polar communication channel code. Furthermore, the decoding algorithm in the present embodiment can reduce the memory amount and the calculation amount as compared with the conventional technique such as [9].

Regarding Definitions and Notations

In the description of the algorithm of the present embodiment, the following definitions and notations will be used.

For a certain n, $N=2^n$ indicates a block length. n is given as a constant, and all the algorithms of the present embodiment can refer to this n. In the present embodiment, bit indexing introduced in [1] is used. The index of the N-dimensional vector can be expressed as $X^N=(X\_0^n, \ldots, X\_1^n)$ as a set of n-bit strings. Here, $0^n$ and $1^n$ represent n-bit all-0 sequences and all-1 sequences, respectively. To represent integer intervals, the following notations are used.

$[0^n:b^n]=\{0^n, \ldots, b^n\}$ $[0^n:b^n)=[0^n:b^n]\setminus\{b^n\}$ $[b^n:1^n]=[0^n:1^n]\setminus[0^n:b^n)$ $(b^n:1^n]=[0^n:1^n]\setminus[0^n:b^n]$ [Math. 1]

For a certain subset I of $[0^n:1^n]$, a subsequence of $X^N$ is defined as follows.

$X_I = \{X_b\}_{b^n \in \mathcal{I}}$ [Math. 2]

It is assumed that $c^l b^k \in \{0, 1\}^{l+k}$ is a concatenation of $b^k \in \{0, 1\}^k$ and $c^l \in \{0, 1\}^l$. For a given $b^k \in \{0, 1\}^k$ and $c^l \in \{0, 1\}^l$, subsets of $c^l[0:b^k]$ and $c^l[0:b^k)$ of $\{0, 1\}^{k+l}$ can be defined as $c^l[0:b^k]=\{c^l d^k : d^k \in [0^k:b^k]\}$ and
$c^l[0:b^k)=\{c^l d^k : d^k \in [0^k:b^k)\}$.

Bipolar Binary Conversion of $b \in \{0, 1\}$ $\mp_b$ [Math. 3]

is defined as $\mp_b = \begin{cases} - & \text{if } b=1 \\ + & \text{if } b=0 \end{cases}$ [Math. 4]

Binary Polar Code

Here, the binary polar information source/communication channel code introduced in the existing techniques [1], [2], [3], and [7] will be described. It is assumed that $\{0,1\}$ is a body having a characteristic of 2. For a given positive integer n, polar conversion G is defined as follows.

$G = \begin{pmatrix} 1 & 0 \\ 1 & 1 \end{pmatrix}^{\otimes n} \Pi_{BR}$ [Math. 5]

Here, a symbol on the right shoulder of the matrix represent the n-th Kronecker product and $\Pi_{BR}$ is the bit inverted permutation matrix [1]. A vector $u \in \{0,1\}^N$ is then defined as $u=xG$ for a given vector $x \in \{0,1\}^N$. It is assumed that $\{I_0, I_1\}$ is a division of $[0^n:1^n]$, and $I_0 \cap I_1 = \phi$ and $I_0 \cap I_1 = [0^n:1^n]$ are satisfied. $\{I_0, I_1\}$ will be defined later.

It is assumed that $X=(X\_0^n, \ldots, X\_1^n)$ and $Y=(Y\_0^n, \ldots, Y\_1^n)$ are random variables, and $U=(U\_0^n, \ldots, U\_1^n)$ is a random variable defined as $U=XG$.

Joint Distribution $P_{U_{\mathcal{I}_0} U_{\mathcal{I}_1} Y} \text{ of } U_{\mathcal{I}_0}, U_{\mathcal{I}_1}, Y$ [Math. 6]

using a joint distribution $P_{XY}$ of $(X,Y)$, $P_{U_{\mathcal{I}_0} U_{\mathcal{I}_1} Y}(u_{\mathcal{I}_0}, u_{\mathcal{I}_1}, y) = P_{XY}(u_{\mathcal{I}_1}, u_{\mathcal{I}_0})G^{-1}, y)$ [Math. 7]

is defined.

In the above formula, the elements of $(u\_I_1, u\_I_0)$ are sorted in the order of indices before the processing of $G^{-1}$. $u\_I_1$ and $u\_I_0$ are referred to as a frozen bit and a non-frozen bit, respectively.

It is assumed that

[Math. 8]

$P_{U_{b^n}|U_{[0^n:b^n)}Y}$ is a conditional probability distribution defined as follows.

$P_{U_{b^n}|U_{[0^n:b^n)}Y}(u_{b^n}|u_{[0^n:b^n)}, y) = \frac{\sum_{u_{(b^n:1^n]}} P_{U_{\mathcal{I}_0} U_{\mathcal{I}_1} Y}(u_{\mathcal{I}_0}, u_{\mathcal{I}_1}, y)}{\sum_{u_{[b^n:1^n]}} P_{U_{\mathcal{I}_0} U_{\mathcal{I}_1} Y}(u_{\mathcal{I}_0}, u_{\mathcal{I}_1}, y)}$ [Math. 9]

For the vector $u\_I_1$ and the auxiliary information $y \in y^N$, a successive cancellation (SC) decoder f that outputs $\hat{u}=f(u\_I_1, y)$ is recursively defined as $\hat{u}_{b^n} = \begin{cases} f_{b^n}(\hat{u}_{[0^n:b^n)}, y) & \text{if } b^n \in \mathcal{I}_0 \\ u_{b^n} & \text{if } b^n \in \mathcal{I}_1 \end{cases}$ [Math. 10]

The set of functions $\{f\_b^n\}\_{b^n \in I_0}$ used in the above formula is defined as $f_{b^n}(u_{[0^n:b^n)}, y) = \arg\max_{u \in \{0,1\}} P_{U_{b^n}|U_{[0^n:b^n)}Y}(u|u_{[0^n:b^n)}, y)$ [Math. 11]

which is the maximum posterior probability discrimination rule after the observation $(u\_[0^n:b^n), y)$.

In the case of a polar information source code (with auxiliary information), $x \in \{0,1\}^N$ is an information source output, $u\_I_1$ is a code word, and $y \in Y^N$ is an auxiliary information source output. The decoder reproduces the information source output $f(u\_I_1, y)G^{-1}$ from code words $u\_I_1$ and y. The (block) decoding error probability is given as $\text{Prob}(f(U\_I_1, Y)G^{-1} \neq X)$.

In the systematic polar communication channel code [3], $I_0'$ and $I_1'$ for a given $(I_0, I_1)$ are defined as follows.

[Math. 12]

$\mathcal{I}_0' = \{b_0 b_1 \ldots b_{n-1} : b_{n-1} \ldots b_1 b_0 \in \mathcal{I}_0\}$ (1)

$\mathcal{I}_1' = \{b_0 b_1 \ldots b_{n-1} : b_{n-1} \ldots b_1 b_0 \in \mathcal{I}_1\}$ (2)

It is assumed that the encoder and the decoder share a vector $u\_I_1$. The encoder calculates $(x\_I_1', u\_I_0)$ satisfying $(x\_I_1', x\_I_0') = (u\_I_1, u\_I_0)G^{-1}$ from a message $x\_I_0'$ and the shared vector $u\_I_1$. Here, the elements of $(x\_I_1', x\_I_0')$ and $(u\_I_1, u\_I_0)$ are sorted in the order of indices before the operation of $G^{-1}$.

The encoder generates a communication channel input $x = (x\_I_0', x\_I_1')$. Here, the elements of $(x\_I_0', x\_I_1')$ are sorted in the order of indices. The decoder reproduces the communication channel input $\hat{x} = f(u\_I_1, y)G^{-1}$ from the communication channel output $y \in y^N$ and the shared vector $u\_I_1$. $\hat{x}\_I_0'$ is reproduction of the message. The (block) decoding error probability is also given as $\text{Prob}(f(U\_I_1, Y)G^{-1} \neq X)$.

In a non-systematic polar communication channel code, $u\_I_0$ is a message, and a vector $u\_I_1$ is shared by an encoder and a decoder. The encoder generates a communication channel input $x \in \{0,1\}^N$ with $x = (u\_I_1, u\_I_0)G^{-1}$. Here, the elements of $(u\_I_1, u\_I_0)$ are rearranged in the order of indices before $G^{-1}$ is operated. The decoder generates a pair of vectors $(u\_I_1, \hat{u}\_I_0) = f(u\_I_1, y)$ from the communication channel output $y \in y^N$ and the shared vector $u\_I_1$. Then, $\hat{u}\_I_0$ is reproduction of the message. The (block) decoding error probability is given as $\text{Prob}(f(U\_I_1, Y) \neq (U\_I_0, U\_I_1))$.

Lemmas will be described below.

Lemma 1 ([2, Theorem 2], [7, Theorem 4.10]): $I_0$ is defined as follows.

$$\mathcal{I}_0 = \left\{ b^n \in [0^n : 1^n] : Z(U_{b^n} \mid U_{[0^n : b^n]}, Y_{[0^n : 1^n]}) \leq 2^{-2^{n\beta}} \right\} \quad [\text{Math. 13}]$$

where $Z$ is a function [2] that gives a Battacharyya parameter. For any $\beta \in [0, 1/2)$, $$\lim_{n \to \infty} \frac{|\mathcal{I}_0|}{2^n} = 1 - H(X \mid Y) \quad [\text{Math. 14}]$$

$$\lim_{n \to \infty} \frac{|\mathcal{I}_1|}{2^n} = H(X \mid Y)$$

are obtained.

There is the following lemma which can be proven as in the previous proof [1].

Lemma 2 ([6, Lemma 2], [8, Formula (1)], [7, Proposition 2.7]):

$$\text{Prob}\left(f(U_{\mathcal{I}_1}, Y)G^{-1} \neq X\right) = \text{Prob}\left(f(U_{\mathcal{I}_1}, Y) \neq (U_{\mathcal{I}_0}, U_{\mathcal{I}_1})\right) \leq \quad [\text{Math. 15}]$$

$$\sum_{b^n \in \mathcal{I}_0} \text{Prob}(f_{b^n}(U_{[0^n : b^n]}, Y) \neq U_{b^n}) \leq$$

$$\sum_{b^n \in \mathcal{I}_0} Z(U_{b^n} \mid U_{[0^n : b^n]}, Y_{[0^n : 1^n]})$$

From the above lemma, a fact is obtained that the rate of the polar code reaches the fundamental limit, and the decoding error probability becomes zero with $n \to \infty$. For example, $I_0$ can be obtained by using a technique introduced in [8]. In the following, it is assumed that any $I_0$ is given.

Symmetric parameterization

Here, a polar conversion based on the symmetric parameterization used in the expression of the conditional probability in the present embodiment will be described. For a given probability distribution $P_U$ of a binary random variable $U$, $\theta$ is defined as follows.

$$\theta = P_U(0) - P_U(1)$$

then, $$P_U(u) = \frac{1 \mp_u \theta}{2} \quad [\text{Math. 16}]$$

is obtained.

$$\mp_u \quad [\text{Math. 17}]$$

is the bipolar binary conversion of $u$.

In the basic polar conversion, a pair of binary random variables $(U_0, U_1)$ is converted as follows.

$$U_0' = U_0 \oplus U_1$$

$$U_1' = U_1 \quad [\text{Math. 18}]$$

where $$\oplus \quad [\text{Math. 19}]$$

indicates addition in a field of characteristic 2. It is assumed that the random variables $U_0, U_1 \in \{0,1\}$ are independent. For each $i \in \{0,1\}$, $\theta_i$ is defined as follows.

$$\theta_i = P_{U_i}(0) - P_{U_i}(1) \quad [\text{Math. 20}]$$

Here, the following equalities are obtained.

[Math. 21]
$$P_{U_0'} = P_{U_0}(0)P_{U_1}(0) + P_{U_0}(1)P_{U_1}(1) \quad (3)$$

$$= \frac{1+\theta_0}{2} \cdot \frac{1+\theta_1}{2} + \frac{1-\theta_0}{2} \cdot \frac{1-\theta_1}{2}$$

$$= \frac{1 + \theta_0 \theta_1}{2}$$

The first equality is obtained from the definition of $U_0'$ and the fact that $U_0$ and $U_1$ are independent of each other. Furthermore, the following equalities are obtained.

[Math. 22]
$$P_{U_0'}(1) = 1 - P_{U_0'}(0) \quad (4)$$

$$= \frac{1 - \theta_0 \theta_1}{2}$$

From Formula (3) and Formula (4),

[Math. 23]
$$P_{U_0'}(u_0') = \frac{1 \mp_{u_0'} \theta_0 \theta_1}{2} \quad (5)$$

is obtained.

$$\mp_{u_0'} \quad [\text{Math. 24}]$$

is the bipolar binary conversion of $u_0'$. $\theta_0'$ is defined as

[Math. 25]
$$\theta_0' = P_{U_0'}(0) - P_{U_0'}(1) \quad (6)$$

From Formula (3) to Formula (6), $$\theta_0' = \theta_1 \theta_0 \quad (7)$$

is obtained.

Since the symmetric parameterization is a binary version of the Fourier transform of a probability distribution [5, Definitions 24 and 25], the right side of Formula (7) corresponds to the Fourier transform of the convolution.

Here,

[Math. 26]

$$P_{U_0'U_1'}(u_0', 0) = P_{U_0}(u_0') P_{U_1}(0) \quad (8)$$

$$= \frac{1 \mp u_0' \theta_0}{2} \cdot \frac{1 + \theta_1}{2}$$

$$= \frac{1 \mp u_0' \theta_0 \theta_1 + \theta_1 \mp u_0' \theta_0}{4}$$

is obtained. The first equality is derived from the definition of $U_0'$ and $U_1'$ and the fact that $U_0$ and $U_1$ are independent of each other. Further,

[Math. 27]

$$P_{U_1'|U_0'}(0 \mid u_0') = \frac{P_{U_1'U_0'}(0, u_0')}{P_{U_0'}(u_0')} \quad (9)$$

$$= \frac{1 + [\theta_1 \mp u_0' \theta_0]/[1 \mp u_0' \theta_1 \theta_0]}{2}$$

$$P_{U_1'|U_0'}(1 \mid u_0') = 1 - P_{U_1'|U_0'}(0 \mid u_0') \quad (10)$$

$$= \frac{1 - [\theta_1 \mp u_0' \theta_0]/[1 \mp u_0' \theta_1 \theta_0]}{2}$$

is obtained.
$\theta_1'$ is defined as follows.

[Math. 28]

$$\theta_1' = P_{U_1'|U_0'}(0 \mid u_0) - P_{U_1'|U_0'}(1 \mid u_0) \quad (11)$$

From Formula (9) to Formula (11),

[Math. 29]

$$\theta_1' = \frac{\theta_1 \mp u_0' \theta_0}{1 \mp u_0' \theta_1 \theta_0} \quad (12)$$

$$= \frac{\theta_1 \mp u_0' \theta_0}{1 \mp u_0' \theta_0'}$$

is obtained. Here, the second equality is obtained from Formula (7).

Successive Cancellation Decoding

Next, an algorithm of successive cancellation decoding executed by the decoding device 200 according to the present embodiment will be described.

Note that, in the present embodiment, notations of the algorithm illustrated in each drawing are general by themselves. For example, "for A do B" means executing B on each element defined by A. "if C then D else E" means that D is executed in a case where the condition C is satisfied (in a case of true), and E is executed in a case where the condition is not satisfied.

The decoding device 200 performs decoding processing of the polar code by executing Algorithm 1 of successive cancellation decoding illustrated in FIG. 5. This algorithm is based on a technique introduced in [9]. Processing contents of updateΘ(Θ, U, n, b″) in line 3 of Algorithm 1 are illustrated in FIG. 6 as Algorithm 2. In addition, processing contents of updateU(U, n, b″⁻¹) in line 9 of Algorithm 1 are illustrated in FIG. 7 as Algorithm 3.

Here, each element of Θ is a conditional probability of 0 and 1 expressed by one parameter by applying the symmetric parameterization, and corresponds to a conditional probability expressing how much the value of the bit to be decoded deviates from ½. This Θ is updated by updateΘ(Θ, U, n, b″).

As illustrated in line 7 of Algorithm 1, whether the value of the bit is 0 or 1 is determined by comparing Θ[n][0] and 0. Note that "0 or 1" in line 7 of Algorithm 1 indicates that the value of the bit may be either 0 or 1.

The computation unit 220 that executes Algorithms 1 to 3 can access (refer to) the number n of times of polar conversion, the frozen bit $u^{(n)}\_I_1$, and the following memory space. The memory space corresponds to the data storage unit 240 of the decoding device 200. The successive cancellation decoding processing executed by Algorithms 1 to 3 will be described below.

[Math. 30]

$$\Theta = \left\{ \Theta[k][c^{n-k}] : \begin{array}{c} k \in \{0, \ldots, n\} \\ c^{n-k} \in [0^{n-k} : 1^{n-k}] \end{array} \right\}$$

$$U = \left\{ U[k][c^{n-k}][b] : \begin{array}{c} k \in \{0, \ldots, n\} \\ c^{n-k} \in [0^{n-k} : 1^{n-k}] \\ b \in \{0, 1\} \end{array} \right\}$$

In the above formula, $\Theta[k][c^{n-k}]$ is a real variable, $U[k][c^{n-k}][b]$ is a binary variable, and $c^0$ is a null character string. Note that $\Theta$ has $\sum_{k=0}^{n} 2^{n-k} = 2^{n+1}-1$ variables, and U has $2\sum_{k=0}^{n} 2^{n-k} = 2^{n+2}-2$ variables.

In the following,

[Math. 31]

$$\{U_{c^n}^{(0)}\} c^n \in [0^n : 1^n]$$

is a memoryless information source. That is,

[Math. 32]

$$P_{U_{[0^n:1^n]}^{(0)}}$$

is defined as

[Math. 33]

$$P_{U_{[0^n:1^n]}^{(0)}}\left(u_{[0^n:1^n]}^{(0)}\right) = \prod_{c^n \in [0^n:1^n]} P_{U_{c^n}^{(0)}}\left(u_{c^n}^{(0)}\right).$$

where

[Math. 34]

$$\{P_{U_{c^n}^{(0)}}\}_{c^n \in [0^n:1^n]}$$

is given depending on the context. In addition,

[Math. 35]

$$\{U_{c^n}^{(0)}\}c^n \in [0^n:1^n]$$

is allowed to be a non-steady state.

$U^{(n)}\_b^n$ is recursively defined (calculated) as

[Math. 36]

$$U_{c^{n-k}b^{k-1}0}^{(k)} = U_{c^{n-k}0b^{k-1}}^{(k-1)} \oplus U_{c^{n-k}1b^{k-1}}^{(k-1)} \quad (13)$$

$$U_{c^{n-k}b^{k-1}1}^{(k)} = U_{c^{n-k}1b^{k-1}}^{(k-1)} \quad (14)$$

for a certain $b^n \in \{0,1\}^n$ and $c^{n-k} \in \{0,1\}^{n-k}$.

At this time, $$U_{[0^n:1^n]}^{(n)} = U_{[0^n:1^n]}^{(0)} G \quad \text{[Math. 37]}$$

obtained. This is a polar conversion of $U^{(0)}\_[0^n:1^n]$. update$\Theta$ ($\Theta$, U, n, $b^n$) in line 3 of Algorithm 1 starts from the following Formula (16), and

[Math. 38]

$$\theta_{b^n}^{(n)} = P_{U_{b^n}^{(n)}|U_{[0^n:b^n]}^{(n)}}\left(0 \mid u_{[0^n:b^n]}^{(n)}\right) - P_{U_{b^n}^{(n)}|U_{[0^n:b^n]}^{(n)}}\left(1 \mid u_{[0^n:b^n]}^{(n)}\right) \quad (15)$$

is calculated recursively.

[Math. 39]

$$\theta_{b^n}^{(0)} = P_{U_{b^n}^{(0)}}(0) - P_{U_{b^n}^{(0)}}(1) \quad (16)$$

Processing contents of update$\Theta$($\Theta$, U, n, $b^n$) in line 3 in Algorithm 1 are shown. In Algorithm 2 of FIG. 6, parameters defined as

[Math. 40]

$$\theta_{c^{n-k}b^k}^{(k)} = P_{U_{c^{n-k}b^k}^{(k)}|U_{c^{n-k}[0^k:b^k]}^{(k)}}\left(0 \mid u_{c^{n-k}[0^k:b^k]}^{(k)}\right) - P_{U_{c^{n-k}b^k}^{(k)}|U_{c^{n-k}[0^k:b^k]}^{(k)}}\left(1 \mid u_{c^{n-k}[0^k:b^k]}^{(k)}\right) \quad (17)$$

are calculated for each $c^{n-k}$ for a given $b^n \in \{0, 1\}^n$. By using Formulas (7), (12), (13), (14), and (17), relations of

[Math. 41]

$$\theta_{c^{n-k}b^{k-1}0}^{(k)} = \theta_{c^{n-k}1b^{k-1}}^{(k-1)} \theta_{c^{n-k}0b^{k-1}}^{(k-1)} \quad (18)$$

$$\theta_{c^{n-k}b^{k-1}1}^{(k)} = \frac{\theta_{c^{n-k}1b^{k-1}}^{(k-1)} \mp u \theta_{c^{n-k}0b^{k-1}}^{(k-1)}}{1 \mp u \theta_{c^{n-k}b^k 0}^{(k)}} \quad (19)$$

can be obtained. Here, $$\mp_u \quad \text{[Math. 42]}$$

is the bipolar binary conversion of $u=u^{(k)}\_c^{n-k}b^{k-1}0$. The purpose of updateU(U, n, $b^{n-1}$) in line 9 of Algorithm 1 is to calculate $u^{(k)}\_c^{n-k}b^{k-1}0$ from $u^{(n)}\_[0^n:b^{n-1}0]$ using the relation of

[Math. 43]

$$u_{c^{n-k}0b^{k-1}}^{(k-1)} = u_{c^{n-k}b^{k-1}0}^{(k)} \oplus u_{c^{n-k}b^{k-1}1}^{(k)} \quad (20)$$

$$u_{c^{n-k}1b^{k-1}}^{(k-1)} = u_{c^{n-k}b^{k-1}1}^{(k)} \quad (21)$$

Formulas (20) and (21) are obtained from Formulas (13) and (14). Here, it is assumed that $u^{(n)}\_[0^n:b^{n-1}0]$ is normally decoded.

Formulas (18) and (19) correspond to lines 5 and 7 of Algorithm 2, respectively, and formulas (20) and (21) correspond to lines 2 and 3 of Algorithm 3, respectively.

After applying lines 3 and 9 of Algorithm 1, respectively, the relation of

[Math. 44]

$$\Theta[k][c^{n-k}] = \theta_{c^{n-k}b^k}^{(k)} \quad (22)$$

$$U[k][c^{n-k}][b_{k-1}] = u_{c^{n-k}b^k}^{(k)} \quad (23)$$

is obtained.

Further, line 7 of Algorithm 1 corresponds to a maximum posterior probability discrimination defined as follows.

$$\hat{u}_{b^n} = \arg\max_{u \in \{0,1\}} P_{U_{b^n}^{(n)}|U_{[0^n:b^n]}^{(n)}}\left(u \mid \hat{u}_{[0^n:b^n]}\right) \quad \text{[Math. 45]}$$

Regarding Application of Algorithm 1 to Information Source Code

In a case where Algorithm 1 is used in a decoder of a polar information source code in which the code word $u^{(n)}\_I_1$ and the auxiliary information vector $y\_[0^n:1^n]$ are used as inputs,

[Math. 46]

$$P_{U_{c^n}^{(0)}}(x) = P_{X_{c^n}|Y_{c^n}}(x \mid y_{c^n}) \text{ for } x \in \{0, 1\} \quad (24)$$

is defined,

[Math. 47]

$$\widehat{x}_{c^n} U[0][c^n][\hat{b}_{-1}] \quad (25)$$

is defined, and reproduction $$\{\widehat{x}_{c^n}\}_{c^n \in [0^n:1^n]} \quad \text{[Math. 48]}$$

is obtained. Here, ^$b_{-1}$ is a null character string.

Regarding Application of Algorithm 1 to Systematic Polar Communication Channel Code In a case where Algorithm 1 is used for a decoder of a systematic polar communication channel code in which the communication channel output vector $y\_[0^n:1^n]$ and the shared vector $u^{(n)}\_I_1$ are used as inputs, with respect to a given communication channel distribution $$\{P_{Y_{c^n}|X_{c^n}}\}_{c^n \in [0^n:1^n]} \quad \text{[Math. 49]}$$

an input distribution $$\{P_{X_{c^n}}\}_{c^n \in [0^n:1^n]}, \quad x \in \{0,1\} \qquad \text{[Math. 50]}$$

and $y\_c^n \in Y$,

[Math. 51]

$$P_{U_{c^n}^{(0)}}(x) = \frac{P_{Y_{c^n}|X_{c^n}}(y_{c^n}|x) P_{X_{c^n}}(x)}{\sum_{x' \in \{0,1\}} P_{Y_{c^n}}(y_{c^n}|x') P_{X_{c^n}}(x')} \qquad (26)$$

is defined. Then, the reproduction $\{\hat{x}\_c^n\}\_c^n \in I_0'$ defined by Formula (25) is obtained. Here, $I_0'$ is defined by Formula (1).

Regarding Application of Algorithm 1 to Non-Systematic Polar Communication Channel Code In a case where Algorithm 1 is applied to a decoder of a non-systematic polar communication channel code, a series of binary variables $\{M[b^n]\}\_b^n \in I_0$ is prepared, and immediately after $U[n][c^0][b_{n-1}]$ (line 7 of Algorithm 1) is updated, $$M[b^n] \leftarrow U[n][c^0][b_{n-1}]$$

is inserted. Algorithm 1 with this modification is shown in FIG. 20.

As a result, reproduction $\hat{u}\_I_0$ defined by $\hat{u}\_b^n = M[b^n]$ can be obtained.

Remark 1: In a case where Algorithm 1 is applied to a binary erasure channel, the value that can be taken by $\Theta[k][c^{n-k}]$ is limited to $\{-1, 0, 1\}$, and $$\Theta[0][b^n] \leftarrow P_{U_{b^n}^{(0)}}(0) - P_{U_{b^n}^{(0)}}(1) \qquad \text{[Math. 52]}$$

which is a value in line 1 of Algorithm 1 can be replaced by $$\Theta[0][b^n] \leftarrow \begin{cases} 1 & \text{if } y_{b^n} = 0 \\ 0 & \text{if } y_{b^n} \text{ is the erasure symbol} \\ -1 & \text{if } y_{b^n} = 1 \end{cases} \qquad \text{[Math. 53]}$$

for a given communication channel output $y\_[0^n:1^n]$.

As described below as Algorithm 2, Algorithm 2 can be improved. Furthermore, this technique can also be used with systematic communication channel codes, as introduced in [3]. There, for a given message vector $x\_I_0'$, $y\_[0^n:1^n]$ is defined as $$y_{b^n} = \begin{cases} x_{b^n} & \text{if } b^n \in I_0' \\ \text{erasure} & \text{if } b^n \in I_1' \end{cases} \qquad \text{[Math. 54]}$$

Successive Cancellation List Decoding

Next, an algorithm of successive cancellation list decoding executed by the decoding device 200 according to the present embodiment will be described. This algorithm is based on a technique introduced in [9].

In the technique according to the present embodiment, a fixed address memory space is used instead of using the stacking memory space in [9]. In the technique according to the present embodiment, since the size of the memory space for calculating the conditional probability is approximately half of that used in [9], the calculation amount of the algorithm according to the present embodiment is approximately half of that introduced in [9].

The decoding device 200 performs decoding processing of the polar code by executing Algorithm 4 of successive cancellation decoding illustrated in FIG. 8. Processing contents of update$\Theta(\Theta[\lambda], U[\lambda], n, b^n)$ in line 5 of Algorithm 4 are illustrated in FIG. 6 as Algorithm 2. Processing contents of extendPath($b^n$, $\Lambda$) in line 7 of Algorithm 4 are illustrated in FIG. 9 as Algorithm 5. Processing contents of splitPath ($b^n$, $\Lambda$) in line 10 of Algorithm 4 is illustrated in FIG. 10 as Algorithm 6. Processing contents of prunePath($b^n$, $\Lambda$) in line 13 of Algorithm 4 is illustrated in FIG. 11 as Algorithm 7. Processing contents of copyPath($\lambda'$, $\lambda$–$\Lambda$) in line 25 of Algorithm 7 is illustrated in FIG. 12 as Algorithm 8. Processing contents of magnifyP($\Lambda$) in line 17 of Algorithm 4 is illustrated in FIG. 13 as Algorithm 9. Processing contents of updateU(U[$\lambda$], n, $b^{n-1}$) in line 19 of Algorithm 4 is illustrated in FIG. 7 as Algorithm 3.

In the calculation by the procedure of Algorithms 2 to 9, the computation unit 220 of the decoding device 100 shown in FIG. 3 accesses the number of times n of the polar conversion, the list size L, the frozen bit $u^{(n)}\_I_1$, the memory spaces $\{\Theta[\lambda]\}^{L-1}_{\lambda=0}$, $\{U[\lambda]\}^{L-1}_{\lambda=0}$, $\{P[\lambda]\}^{2L-1}_{\lambda=0}$, and $\{\text{Active}[\lambda]\}^{2L-1}_{\lambda=0}$, and performs processing. The memory space corresponds to the data storage unit 240.

Note that $\Theta[\lambda]$ and $U[\lambda]$ are calculated in Algorithms 2 and 3. $\{P[\lambda]\}^{2L-1}_{\lambda=1}$ is a series of real variables, and $\{\text{Active}[\lambda]\}^{2L-1}_{\lambda=1}$ is a series of binary variables.

After applying Algorithm 4, the calculation result is stored in $\{U[\lambda]\}^{L-1}_{\lambda=0}$ and $\{P[\lambda]\}^{2L-1}_{\lambda=0}$ to satisfy

[Math. 55]

$$\frac{P[\lambda]}{2^N} = \prod_{b^n \in [0^n:1^n]} P_{U_{b^n}^{(n)}|U_{[0^n:b^n]}^{(n)}}\left(\hat{u}_{b^n}^{(n)}(\lambda) \mid \hat{u}_{[0^n:b^n]}^{(n)}(\lambda)\right) \qquad (27)$$

$$= P_{U_{[0^n:1^n]}^{(n)}}\left(\hat{u}_{[0^n:1^n]}^{(n)}(\lambda)\right)$$

and $$U[\lambda][0][c^n][b_{-1}] = \hat{u}_{c^n}^{(0)}(\lambda) \qquad \text{[Math. 56]}$$

$$\hat{u}_{[0^n:1^n]}^{(n)}(\lambda) = \hat{u}_{[0^n:1^n]}^{(0)}(\lambda) G^*$$

where $$\hat{u}_{[0^n:1^n]}^{(n)}(\lambda) \qquad \text{[Math. 57]}$$

is the $\lambda$th survival path. In line 5 of Algorithm 7 that performs the processing of selecting the survival path, L paths $\hat{u}^{(n)}\_[0^n:b^n]$ with the highest probability (likelihood)

[Math. 58]

$$\frac{P[\lambda]}{2^{|[0^n:b^n]|}} = \prod_{d^n \in [0^n:b^n]} P_{U_{d^n}^{(n)}|U_{[0^n:d^n]}^{(n)}}\left(\hat{u}_{d^n}^{(n)}(\lambda) \mid \hat{u}_{[0^n:d^n]}^{(n)}(\lambda)\right) \qquad (28)$$

$$= P_{U_{[0^n:b^n]}^{(n)}}\left(\hat{u}_{[0^n:b^n]}^{(n)}(\lambda)\right)$$

are selected where $$\hat{u}_{[0^n:b^n]}^{(n)}(\lambda) \qquad \text{[Math. 59]}$$

is the $\lambda$th survival path.

Regarding Application of Algorithm 4 to Information Source Code

In a case where Algorithm 4 is used in a decoder of a polar information source code, accessing the code word u_I$_1$ and the auxiliary information vector $\{y\_b^n\}\_b^n \in [0^n:1^n]$, $$P_{U_{b^n}^{(0)}} \qquad \text{[Math. 60]}$$

is defined by Formula (24), and reproduction $$\{\widehat{x}_{c^n}(l)\}_{c^n \in [0^n:1^n]} \qquad \text{[Math. 61]}$$

is obtained. The above reproduction is defined below.

[Math. 62]

$$\widehat{x}_{c^n}(l) = U[l][0][c^n][b_{-1}] \qquad (29)$$

where

[Math. 63]

$$l = \underset{\lambda}{\arg\max} P[\lambda] \qquad (30)$$

That is, 1 in Formula (30) is the most probable path (sequence).

In a case where $s = \text{parity}(x^n)$ is added to the code word u_I$_1$ by using an external parity check function parity, with respect to 1 satisfying $$\text{parity}(\{\widehat{x}_{c^n}(l)\}_{c^n \in [0^n:1^n]}) = s \qquad \text{[Math. 64]}$$

reproduction is defined as (29).

Regarding Application of Algorithm 4 to Systematic Polar Communication Channel Code In a case where Algorithm 4 is used in a decoder of a systematic polar communication channel code, accessing the communication channel output vector $\{y\_b^n\}\_b^n \in [0^n:1^n]$ and the shared vector u_I$_1$, reproduction defined by Formulas (29) and (30)

$$\{\widehat{x}_{c^n}\}_{c^n \in \mathcal{I}_0'} \qquad \text{[Math. 65]}$$

is obtained. Here, I$_0$' is defined by Formula (1).

In a case where the code word (for example, polar code with CRC [9]) having a check vector s satisfying $s = \text{parity}(x^n)$ for all the communication channel inputs $x^n$ is used using the external parity check function parity, with respect to 1 satisfying $$\text{parity}(\{\widehat{x}_{c^n}(l)\}_{c^n \in [0^n:1^n]}) = s \qquad \text{[Math. 66]}$$

reproduction $$\{\widehat{x}_{c^n}\}_{c^n \in \mathcal{I}_0'} \qquad \text{[Math. 67]}$$

is defined as (29).

Regarding Application of Algorithm 4 to Non-Systematic Polar Communication Channel Code In a case where Algorithm 4 is used for a decoder of a non-systematic polar communication channel code, the binary variable $$\{M[\lambda][l]\} \lambda \in \{0, \dots L-1\}, b^n \in \mathcal{I}_0 \qquad \text{[Math. 68]}$$

is prepared, and immediately after $U[\lambda][n][c^0][b_{n-1}]$ and $U[\wedge+\lambda][n][c^0][b_{n-1}]$ are updated (lines 5 and 6 of Algorithm 6, lines 8, 11, 15, and 26 of Algorithm 7), respectively, $$M[\lambda][b^n] \leftarrow U[\lambda][n][c^0][b_{n-1}]$$

$$M[\wedge+\lambda][b^n] \leftarrow U[\wedge+\lambda][n][c^0][b_{n-1}] \qquad \text{[Math. 69]}$$

is inserted.

[Math. 70]

$$\hat{u}_{b^n}(l) = M[l][b^n] \qquad (31)$$

is defined, and reproduction $$\{\hat{u}_{b^n}(l)\} b^n \in \mathcal{I}_0 \qquad \text{[Math. 71]}$$

is obtained. Here, 1 is a maximum likelihood sequence defined by Formula (30). The modified Algorithm 6 is shown in FIG. 21, and the modified algorithm 7 is shown in FIG. 22.

In a case where the code word (for example, polar code with CRC [9]) having a check vector s satisfying $s = \text{parity}(x^n)$ for all the communication channel inputs $x^n$ is used using the external parity check function parity, with respect to 1 in which the corresponding communication channel input, which is defined by Formula (29), $$\{\widehat{x}_{c^n}(l)\}_{c^n \in [0^n:1^n]} \qquad \text{[Math. 72]}$$

satisfies $$\text{parity}(\{\widehat{x}_{c^n}(l)\}_{c^n \in [0^n:1^n]}) = s \qquad \text{[Math. 73]}$$

reproduction of non-systematic code $$\{\hat{u}_{b^n}(l)\} b^n \in \mathcal{I}_0 \qquad \text{[Math. 74]}$$

is defined as Formula (31).

Remark 2: Line 17 of Algorithm 4 is unnecessary in a case where a real variable with infinite precision is used. In the above description, it is assumed to use a real variable with finite precision (floating point) in order to avoid $P[\lambda]$ becoming 0 due to truncation when $b^n$ increases. Regardless of whether $P[\lambda]$ is infinite precision or not, while ($b^n = 0^n$) and $b^n \in I_1$ are continuously satisfied from the beginning, line 17 of Algorithm 4 and line 2 of Algorithm 5 can be skipped.

Note that this type of technique is used in [9, Algorithm 10, lines 20 to 25], and this technique has been repeated Nn times. In contrast to that, Algorithm 4 in the present embodiment uses this technique outside the update of the parameter $\{\Theta[\lambda]\}^{L-1}_{\lambda=0}$ (Algorithm 2), and magnifyP($\lambda$) is repeated N times.

Remark 3: Assuming that L is a power of 2, $\Lambda = L$ is always satisfied in line 13 of Algorithm 4. Therefore, since $\Lambda + l \geq L$ is always satisfied, line 14 of Algorithm 4 and lines 9 to 12 of Algorithm 7 can be omitted. FIG. 23 illustrates Algorithm 4 after skip processing of Remark 2 and omission of Remark 3 with respect to Algorithm 4. In addition, Algorithm 7 after omission of Remark 3 with respect to Algorithm 7 is illustrated in FIG. 24. Note that line 9 of Algorithm 4 in FIG. 23 corresponds to skip processing of Remark 2 with respect to Algorithm 5 in FIG. 9, skip is not performed in extendPath that calls line 18 of Algorithm 4 in FIG. 23, and the processing of Algorithm 5 in FIG. 9 is executed as it is. Further, FIG. 25 illustrates a modification when Algorithm 7 illustrated in FIG. 24 is applied to the non-systematic communication channel code.

Remark 4: Since Algorithm 6 and Algorithm 7 have the same lines 2 to 3, lines 2 to 3 of Algorithm 6 can be omitted, and then lines 1 to 4 of Algorithm 7 can be moved between the line 8 and the line 9 of Algorithm 4.

Implementation of Binary Representation of Index

The description so far has used a binary representation of the index. Implementation of this representation will now be described.

In an implementation, the binary representation $b^k \in [0^k: 1^k]$ may be represented by a corresponding integer in $\{0, \ldots, 2^k-1\}$. It is assumed that $i(b^k)$ is the corresponding integer of $b^k$.

For a given $b^k \in [0^k:1^k]$, $b_{k-1}$ is the least significant bit of $b^k$, and the corresponding integer can be obtained as $i(b_{k-1})==i(b^k) \bmod 2$. This is used in lines 5, 7, and 9 of Algorithm 1 and lines 2, 3, and 5 of the algorithm.

In line 9 of Algorithm 1 (FIG. 5), line 2 of Algorithm 2 (FIG. 6), and line 5 of Algorithm 3 (FIG. 7), $b^{k-1}$ is used for a given $b^k$. $b^{k-1}$ can be obtained by using a 1-bit right shift of $b^k$. Alternatively, a corresponding integer can be obtained by using a relational expression of $i(b^{k-1})=\text{floor}(i(b^k)/2)$. Here, floor is a function that outputs an integer value obtained by rounding down decimal places with respect to an input of a real number.

In lines 5 and 7 of Algorithm 2 and lines 2 and 3 of Algorithm 3, $c^{n-k}0$ can be obtained by setting the least significant bit of $c^{n-k}0$ to 1 and using $c^{n-k}$ and a 1-bit left shift of $c^{n-k}1$. Alternatively, the corresponding integer can be obtained using the following relational expression.

$$i(c^{n-k}0)=2i(c^{n-k})$$

$$i(c^{n-k}1)=2i(c^{n-k})+1 \qquad \text{[Math. 75]}$$

In lines 5 and 7 of Algorithm 1, line 3 of Algorithm 5, lines 5 and 6 of Algorithm 6, and lines 8, 11, 15, and 26 of Algorithm 7, the corresponding integer of the null character string $c^0$ can be defined as $i(c^0)=0$. When k=n, this also appears in lines 5 and 7 of Algorithm 2 and lines 2 and 3 of Algorithm 3. Here, the null character string is distinguished from the binary symbol 0 according to the value k. In lines 2 and 3 of Algorithm 3, the null character string $b_{-1}$ appears when k=1. $i(b_{-1})=0$ can be defined and can be distinguished from the binary symbol 0 according to the value k. The following relational expression is obtained.

$$i(c^0 0)=2i(c^0)$$

$$i(c^0 1)=2i(c^0)+1$$

$$i(b_{-1})=\text{floor}(i(b^1)/2) \qquad \text{[Math. 76]}$$

Regarding Improvement of Algorithm 2 in Case of Assuming $\Theta[k][c^{n-k}] \in \{-1, 0, 1\}$ As described in Remark 1, in a case where Algorithm 1 is applied to the binary erasure channel, $\Theta[k][c^{n-k}] \in \{-1,0,1\}$ is obtained. Given this, two refinements to Algorithm 2 can be introduced.

First, FIG. 14 illustrates Algorithm 2. In this Algorithm 2, it is assumed that $\Theta[k][c^{n-k}]$ is represented by a 3-bit signed integer including a sign bit and two bits representing an absolute value.

FIG. 15 illustrates Algorithm 2. In this Algorithm 2, It is assumed that $$\Theta[k][c^{n-k}]=(\Theta_-[k][c^{n-k}], \Theta_1[k][c^{n-k}]) \qquad \text{[Math. 77]}$$

is a 2-bit signed integer including a sign bit $$\Theta_-[k][c^{n-k}] \qquad \text{[Math. 78]}$$

and two bits representing an absolute value bit $\Theta_1[k][c^{n-k}]$. Further, line 7 of Algorithm 1 can be replaced with $$U[n][c^0][b_{n-1}] \leftarrow \begin{cases} \Theta_-[n][0] & \text{if } \Theta_1[n][0] = 1 \\ 0 \text{ or } 1 & \text{otherwise} \end{cases} \qquad \text{[Math. 79]}$$

or simply with $$U[n][c^0][b_{n-1}] \leftarrow \Theta_-[n][0] \qquad \text{[Math. 80]}$$

In this Algorithm 2, $\wedge$ represents an AND computation, $\vee$ represents an OR computation, and $$\oplus \qquad \text{[Math. 81]}$$

represents an XOR computation.

Algorithm of Line 5 of Algorithm 7

Here, the content of the algorithm in line 5 of Algorithm 7 shown in FIG. 11 will be described. In the present embodiment, line 5 of Algorithm 7 can be implemented by Algorithm 7-1 (markPath($\lambda$)) illustrated in FIG. 16. The algorithm of selectPath(0, 2·$\lambda$−1) in line 5 in Algorithm 7-1 is shown in FIG. 17 as Algorithm 7-2. The algorithm of partition(left,right) on line 2 in Algorithm 7-2 is shown in FIG. 18 as Algorithm 7-3. The algorithm of swapIndex in Algorithm 7-3 is shown in FIG. 19 as Algorithm 7-4.

Algorithms 7-1 to 7-4 can access the memory spaces $\{P[\lambda]\}^{2L-1}_{\lambda=0}$, $\{\text{Index}[\lambda]\}^{2L-1}_{\lambda=1}$, and $\{\text{Active}[\lambda]\}^{2L-1}_{\lambda=0}$. Here, Index $[X] \in \{0, \ldots 2L-1\}$ is an integer variable. The calculation result is stored in $\{\text{Active}[\lambda]\}^{2\Lambda-1}_{\lambda=0}$.

Remark 5: As mentioned in [9], instead of adopting selectPath(0, 2·$\Lambda$−1) in line 5 of Algorithm 7-1, $\{\text{Index}[\lambda]\}^{\Lambda-1}_{\lambda=0}$ may be simply sorted to obtain P[Index[0]]≥P[Index[1]]≥ … ≥P[Index[$\Lambda$−1]]. The time complexity of sorting is O($\Lambda$log$\Lambda$), but in a case where $\Lambda$ is small, the time complexity may be faster than selectPath(0,2·$\Lambda$−1).

Remark 6: Line 1 (can be omitted) of Algorithm 7-3 guarantees that the average time complexity of selectPath(0,2·$\Lambda$−1) is O($\Lambda$). By selecting the index corresponding to the median of $\{P[\lambda]\}^{right}_{\lambda=left}$, this line can be replaced, and the worst-case time complexity O($\Lambda$) can be guaranteed (refer to [4]).

Summary of Each Algorithm

Hereinafter, as a summary of each algorithm, input, output, and the like for each algorithm will be described. Note that the number n of times of polar conversion is a constant, and can be referred to from all the algorithms. The block length is $N=2^n$.

For example, the input information described below is input from the input unit 210 in the decoding device 200 shown in FIG. 3, stored in the data storage unit 240, and referred to by the computation unit 220 that executes the algorithm. Reference to information by the computation unit 220 that executes the algorithm may be expressed as input of information to the algorithm. A computation result by the computation unit 220 is output to and stored in the data storage unit 240. The computation result (original message) is read from the data storage unit 240 by the computation unit 220 and output from the output unit 230.

19

Algorithm 1: FIG. 5

Input

The input to Algorithm 1 is as follows.

Position information $I_1$ of frozen bit This is a subset of $\{0^n, \ldots, 1^n\}$.

Information $u\_I_1$ of frozen bit in the case of the information source code, the information source code is transmitted as a code word from the encoding device 100 to the decoding device 200.

The code word in the case of the information source code is more specifically as follows.

The encoding device 100 defines $u^{(0)}\_b^n = x\_b^n$ for the information source output $x\_[0^n:1^n]$, and applies a known polar conversion algorithm to obtain $\{u[lsb(n)][b^n]\}\_b^n \in [0^n:1^n]$. At this time, $$\{u[lsb(n)][b^n]\}\_b^n \in I_1$$

is a code word.

Series of Probability Distributions $$\{P_{U_{b^n}^{(0)}}\}_{b^n \in [0^n:1^n]} \quad \text{[Math. 82]}$$

This is set as follows by the computation unit 220 depending on the object to be applied.

In the case of the information source code, the information observed by the encoding device 100 is set as $(X_1, \ldots, X_n)$, and the auxiliary information observed by the decoding device 200 is set as $(Y_1, \ldots, Y_n)$. While conditional probability distribution of $X\_b^n$ after observation of $Y\_b^n$ is $$P_{X_{b^n}|Y_{b^n}} \quad \text{[Math. 83]}$$

after the observation of the auxiliary information $y\_[0^n:1^n]$, $$P_{U_{b^n}^{(0)}} \quad \text{[Math. 84]}$$

is set by the above-described Formula (24).

In the case of the communication channel code, the communication channel input is $(X_1, \ldots, X_n)$, and the communication channel output observed by the decoding device 200 is $(Y_1, \ldots, Y_n)$. The conditional probability distribution of the communication channel is $$P_{Y_{b^n}|X_{b^n}} \quad \text{[Math. 85]}$$

At this time, after observing the communication channel output $y\_[0^n:1^n]$,

[Math. 86]

$$P_{U_{b^n}^{(0)}}$$

is set by the above-described Formula (26).

The communication channel input for the systematic communication channel code is more specifically as follows.

The encoding device 100 sets $x\_I_0'$ as a message vector and $u^{(0)}\_I_1$ as information shared by the encoding device 100 and the decoding device 200 (for example, all are set to 0).

20

Then, a known polar code algorithm is applied to obtain $(x\_I_1', u\_I_0)$ from $(x\_I_0', u\_I_1)$. Here, the relationship of $I_0$, $I_1$, $I_0'$, and $I_1'$ is defined by the above-described Formulas (1) and (2). At this point, the communication channel input (also referred to as a code word) that is the output of encoding device 100 is obtained by aligning $(x\_I_0', x\_I_1')$ in the order of indices.

The communication channel input for the non-systematic communication channel code is more specifically as follows.

The encoding device 100 sets $u^{(0)}\_I_0$ as a message vector and $u^{(0)}\_I_1$ as information shared by the encoding device 100 and the decoding device 200 (for example, all are set to 0). By applying a known polar code algorithm to this, $$\{u[lsb(n)][b^n]\}\_b^n \in [0^n:1^n]$$

is obtained and set as a communication channel input (also referred to as a code word) which is an output of the encoding device 100.

Output

As described above, the output from Algorithm 1 is stored in the memory space shown in [Math. 30].

The reproduction information as the decoding result is obtained by the following interpretation depending on the object to be applied.

In the case of the information source code, the computation unit 220 sets $\hat{x}\_[0^n:1^n]$ defined in the above-described Formula (25) as the reproduced information source sequence with reference to the memory space of U shown in [Math. 30].

In the case of the systematic communication channel code, the computation unit 220 refers to the memory space of U shown in [Math. 30], and sets $\hat{x}\_I_0'$ defined in the above-described Formula (25) as a reproduced message. Here, $I_0'$ is as described above.

In the case of the non-systematic communication channel code, as described above, the modified algorithm 1 shown in FIG. 20 is used. That is, the memory area $\{M[b^n]:b^n \in I_0\}$ corresponding to the position is prepared in the non-frozen bit, and the result is stored. The reproduction message becomes $\hat{u}\_I_0$ defined by $\hat{u}\_b^n = M[b^n]$.

Algorithm 2: FIGS. 6, 14, and 15

Input

The input to Algorithm 2 is as follows.

Reference is made to the memories $\Theta$ and U used in Algorithm 1.

Integer k.

Binary representation $b^n$ of index. As described previously, implementations may also handle $b^n$ as an integer.

Output

In a case where the condition is satisfied, Algorithm 2 is recursively called, and the content of $\Theta$ is rewritten.

Algorithm 3: FIG. 7

Input

Reference is made to the memory U used in Algorithm 1.
Integer k.
Binary representation $b^n$ of index Implementations may also treat $b^n$ as an integer.

Output

After the content of U is rewritten, when the condition is satisfied, Algorithm 3 is recursively called.

Algorithm 4: FIG. 8

Input

The same information as the input information to Algorithm 1
List size L.

Output

The output from Algorithm 4 is stored in the memory spaces (memory areas) of $\Theta$, U, and P as described above. Specifically, this is as follows.

$$\left\{\Theta[\lambda][k][c^{n-k}]: \begin{array}{c} \lambda \in \{0, \ldots, L\} \\ k \in \{0, \ldots, n\} \\ c^{n-k} \in [0^{n-k}: 1^{n-k}] \end{array}\right\} \quad \text{[Math. 87]}$$

$$\left\{U[\lambda][k][c^{n-k}][b]: \begin{array}{c} \lambda \in \{0, \ldots, L\} \\ k \in \{0, \ldots, n\} \\ c^{n-k} \in [0^{n-k}: 1^{n-k}] \\ b \in \{0, 1\} \end{array}\right\} \quad \text{[Math. 88]}$$

$$\{P[\lambda]: \lambda \in \{0, \ldots, L\}\} \quad \text{[Math. 89]}$$

The reproduction information as the decoding result is obtained by the following interpretation depending on the object to be applied.

In the case of the information source code, the computation unit 220 obtains l by the above-described Formula (30) with reference to the above P, and with reference to the above U, $$\hat{x}_{[0^n:1^n]}(1) \quad \text{[Math. 90]}$$

which is defined by Formula (25), is set as reproduced information source sequence.

In the case of the systematic communication channel code, the computation unit 220 obtains l by the above-described Formula (30) with reference to the P, and with reference to the above U, $\hat{x}\_I_0$ defined by Formula (25) is set as a reproduced message. Here, $I_0$ is as described above.

In a case where Algorithms 4 to 7 are applied to a non-systematic communication channel code, as described above, the memory area shown in [Math. 68] is prepared and the result is stored. The modified algorithms 6 and 7 accompanying this are as shown in FIGS. 21, 22, and 25, respectively. The reproduction message is as shown in [Math. 70] and [Math. 71].

Algorithm 5: FIG. 9

Input

Reference is made to the above memories $\Theta$, U, and P.
The information $u\_I_1$ of the frozen bit described in the input of Algorithm 4 (Algorithm 1) is referred to.
Binary representation $b^n$ of index Implementations may also treat $b^n$ as an integer.
Size $\Lambda$ of valid (active) list

Output

The content of the above memories U and P is rewritten.

Algorithm 6: FIG. 10

Input

Reference is made to the above memories $\Theta$, U, and P.
Binary representation $b^n$ of index Implementations may also treat $b^n$ as an integer.
Size $\Lambda$ of valid (active) list

Output

The content of the above memories U and P is rewritten.

Algorithm 7: FIGS. 11, 22, 24, and 25

Here, the memory $$\{\text{Active}[\lambda]: \lambda \in \{0, \ldots, 2L-1\}\}$$

is used.

Input

Reference is made to the above memories $\Theta$, U, P, and Active.
Binary representation $b^n$ of index Implementations may also treat $b^n$ as an integer.
Size $\Lambda$ of valid (active) list

Output

The content of the above memories U, P, and Active is rewritten. In Algorithm 7 illustrated in FIG. 25, the content of M is further rewritten.

Algorithm 8: FIG. 12

Algorithm 8 is an algorithm corresponding to copyPath $(\lambda',\lambda)$ in line 4 of Algorithm 6 (FIG. 10) and lines 10 and 25 of Algorithm 7 (FIG. 11), and implements a function of copying the state of the $\lambda$th list to a memory that stores the state of the $\lambda'$th list.

Input

Reference is made to the above memories $\Theta$ and U.
Index $\lambda'$ of list of copy destinations.
Index $\lambda'$ of list of copy sources.

Output

The content of the above memories $\Theta$ and U is rewritten.

Algorithm 9: FIG. 13

The algorithm 9 is an algorithm that implements rewriting of content of the above memory P (setting the maximum value to 1 without change of ratio of real number stored in memory).

Input

Reference is made to the above memory P.
Size $\Lambda$ of valid (active) list.

Output

The content of the above memory P is rewritten.

Algorithm 2: FIGS. 14 and 15

Algorithm 2 illustrated in FIGS. 14 and 15 is an algorithm that speeds up Algorithm 2 when Algorithm 1 is applied to a polar code for an erasure channel. The input/output is the same as that of Algorithm 2.

Algorithms 7-1 to 7-4: FIGS. 16 to 19

Algorithms 7-1 to 7-4 are algorithms that set Active[$\lambda$]=1 only to the top L values of P[$\lambda$] as described in line 5 of Algorithm 7 (FIG. 11).

Simple Configuration

As described above, in order to simplify the configuration, Algorithm 4 and Algorithm 7 in a case where it is assumed that the set $I_0$ is not an empty set, L is a power of 2, and only a real number computation with finite accuracy is possible (although not realistic, in the case of infinite accuracy, line 27 of algorithm 4 in FIG. 23 can be deleted) are as shown in FIGS. 23 to 25. Note that, in a case where $I_0$ is an empty set, L=1 is set, and the processing up to lines 5 to 8 of Algorithm 4 illustrated in FIG. 23 is skipped and the processing up to line 14 is finished.

Configuration of Decoding Device 200 for Erasure Channel

As described in Remark 1, in the case of the decoding device 200 for the erasure channel, it can be assumed that the value $\Theta[k][c^{n-k}]$ takes any value of $\{-1,0,1\}$.

When line 7 of Algorithm 1 (FIG. 5) is replaced with $$U[n][c^0][b_{n-1}] \leftarrow \begin{cases} 0 & \text{if } \Theta[n][0] = 1 \\ 1 & \text{if } \Theta[n][0] = -1 \\ 0 \text{ or } 1 & \text{if } \Theta[n][0] = 0 \end{cases} \qquad [\text{Math. 91}]$$

regardless of the method of encoding $\{-1,0,1\}$ into $\Theta[k][c^{n-k}]$, processing in lines 4 to 8 of Algorithm 1 (FIG. 5) may be any processing as long as the values in the tables illustrated in FIGS. 26 to 28 are substituted into $\Theta[k][c^{n-k}]$. Two examples (Example A, Example B) will be described below.

In a case of being applied to Algorithms 4 to 9, $\Theta[\lambda][k][c^{n-k}]$ can be a variable having a value of $\{-1,0,1\}$, and P[$\lambda$] can be an N-bit unsigned integer variable. In this case, the processing of magnifyP in line 17 of Algorithm 4 is unnecessary. Further, Since $$\mp \Theta[\lambda][n][b^n] \in \{0, 1, 2\} \qquad [\text{Math. 92}]$$

is established, for line 2 of Algorithm 5, lines 2 to 3 of Algorithm 6, and lines 2 to 3 of Algorithm 7,
in a case of $$\mp \Theta[\lambda][n][b^n] = 2 \qquad [\text{Math. 93}]$$

calculation is possible using 1-bit left shift. cl Example A: Method Using Integer Addition/Subtraction The division can be omitted by using Algorithm 2 illustrated in FIG. 14 instead of Algorithm 2 in FIG. 6. Since carrying-up occurs, three bits including a sign are required for $\Theta[k][c^{n-k}]$.

Note that, when this method is applied to successive cancellation list decoding (Algorithm 4), a change may be made only by regarding a real variable as an integer variable.

Example B: Method of Using Sign Bit and Absolute Value Bit

Further, $\Theta[k][c^{n-k}]$ is represented as illustrated in FIG. 29.

$$\Theta_{-}[k][c^{n-k}], \Theta_{1}[k][c^{n-k}] \qquad [\text{Math. 94}]$$

may also be encoded with two bits.

In this case, the tables illustrated in FIGS. 30 to 32 may be implemented in lines 4 to 8 of Algorithm 2.

This can be implemented by replacing line 7 of Algorithm 1 (FIG. 5) with line 7 illustrated in FIG. 33, and using Algorithm 2 illustrated in FIG. 15 instead of Algorithm 2 in FIG. 6. Line 7 of Algorithm 1 may be $$U[n][c^0][b_{n-1}] \leftarrow \begin{cases} \Theta_{-}[n][0] & \text{if } \Theta_{1}[n][0] = 1 \\ 0 \text{ or } 1 & \text{otherwise} \end{cases} \qquad [\text{Math. 95}]$$

Note that, when this method is applied to successive cancellation list decoding (Algorithm 4), $$\Theta[k][c^{n-k}] = (\Theta_{-}[k][c^{n-k}], \Theta_{1}[k][c^{n-k}]) \qquad [\text{Math. 96}]$$

is interpreted as a 2-bit signed integer of a sign part 1-bit and a numerical part 1-bit.

Regarding Effects of Embodiment

In a case where the technique according to the present embodiment (referred to as a proposed method) is compared with the technique of Reference Literature [9] (referred to as a conventional method), two values $P_\lambda[\beta][0]$ and $P_\lambda[\beta][1]$ indicated by P of the conventional method are expressed by one value $\Theta[k][c^{n-k}]$ by applying the symmetric parameterization in the proposed method [Algorithm 2], and thus, in the proposed method, the used memory amount is half that in the conventional method. As a result, the calculation amount can also be reduced. In particular, in list decoding, it is possible to greatly reduce a processing time in a case where states of candidates are copied.

In addition, a stack memory is used in the processing of the conventional method, but a memory space having a fixed address is directly operated in the proposed method. Thus, the operation in the conventional method regarding the stack memory is simplified in the proposed method.

Furthermore, with the technique according to the present embodiment, it is possible to uniformly perform decoding for the communication channel code and decoding for the information source code.

Summary of Embodiment

In the present specification, at least a decoding device, a decoding method, and a program described in clauses described below are described.

Clause 1

A decoding device, including:
an input unit that inputs a code word encoded by a polar code from an original message;
a computation unit that decodes the original message from the code word based on a conditional probability expressed by a symmetric parameterization and having observation information as a condition; and
an output unit that outputs the decoded original message.

Clause 2

The decoding device according to clause 1, in which
in a case where the decoding device is applied to decoding for an information source code,
the input unit inputs information of a frozen bit as the code word from a noise-free communication channel or a storage medium, and
the computation unit decodes the original message by using auxiliary information as the observation information.

Clause 3

The decoding device according to clause 1, in which
in a case where the decoding device is applied to decoding for a communication channel code,
the input unit inputs, as the code word, a communication channel output from a communication channel having noise, and
the computation unit decodes the original message by using the communication channel output as the observation information.

Clause 4

The decoding device according to clause 3, in which
in a case where the decoding device is applied to decoding for a systematic communication channel code,
information of a frozen bit is shared between an encoding side and a decoding side,
the input unit inputs the communication channel output in which the original message obtained by polar conversion on the encoding side and an additional information are used as communication channel inputs, and
the computation unit decodes the original message by using the information of the frozen bit and the communication channel output.

Clause 5

The decoding device according to clause 3, in which
in a case where the decoding device is applied to decoding for a non-systematic communication channel code,
information of a frozen bit is shared between an encoding side and a decoding side,
the input unit inputs the communication channel output in which information of non-frozen bit and information obtained by polar conversion from the information of the frozen bit on the encoding side are used as communication channel inputs, and
the computation unit decodes the original message by storing a determination result of 0 or 1 in a memory area corresponding to a position of a non-frozen bit based on the information of the frozen bit and the communication channel output.

Clause 6

The decoding device according to any one of clauses 1 to 5, in which
the computation unit executes list decoding for selecting a sequence of a most probable path from among the number (predetermined list size) of survival paths.

Clause 7

A decoding method executed by a decoding device, including:
an input step of inputting a code word encoded by a polar code from an original message;
a computation step of decoding the original message from the code word based on a conditional probability expressed by a symmetric parameterization and having observation information as a condition; and
an output step of outputting the decoded original message.

Clause 8

A program for causing a computer to function as each unit in the decoding device according to any one of clauses 1 to 6.

Although the present embodiment has been described above, the present invention is not limited to such a specific embodiment, and various modifications and changes can be made within the scope of the gist of the present invention described in the claims.

REFERENCE LITERATURE

[1] E. Arikan, "Channel polarization:a method for constructing capacity-achieving codes for symmetric binary-input memoryless channels", IEEE Trans. Inform. Theory, vol. IT-55, no. 7, pp. 3051-3073, Jul. 2009.
[2] E. Arikan, "Source polarization", Proc. 2010 IEEE Int. Symp. Inform. Theory, Austin, U.S.A., Jun. 13-18, 2010, pp. 899-903. (corresponding to Non-Patent Literature 2)
[3] E. Arikan, "Systematic polar coding", IEEE Communications Letters, vol. 15, no. 8, pp. 860-862, Aug. 2010.
[4] M. Blum, R. W. Floyd, V. Pratt, R. L. Rivest, and R. E. Tarjan, "Time bounds for selection", J. Computer and System Sciences, vol. 7, no. 4, pp. 448-461, 1973.
[5] R. Mori and T. Tanaka, "Source and channel polarization over finite fields and Reed-Solomon matrices", IEEE Trans. Inform. Theory, vol. IT-60, no. 5, pp. 2720-2736, May 2014.
[6] J. Muramatsu, "Successive-cancellation decoding of linear source code", Proceedings of the 2019 IEEE Information Theory Workshop, Visby, Sweden, Aug. 25-28, 2019. Extended version available at arXiv: 1903.11787[cs.IT], 2019.

[7] E. S, as,oglu, "Polarization and polar codes", Fund. Trends Commun. Inf. Theory, vol. 8, no. 4, pp. 259-381, Oct. 2012.

[8] I. Tal and A. Vardy, "How to construct polar codes", IEEE Trans. Inform. Theory, vol. IT-59, no. 10, pp. 6563-6582, Oct. 2013.

[9] I. Tal and A. Vardy, "List decoding of polar codes", IEEE Trans. Inform. Theory, vol. IT-61, no. 5, pp. 2213-2226, May. 2015. (corresponding to Non-Patent Literature 1)

REFERENCE SIGNS LIST

100 Encoding device
200 Decoding device
210 Input unit
220 Computation unit
230 Output unit
240 Data storage unit
1000 Drive device
1001 Recording medium
1002 Auxiliary storage device
1003 Memory device
1004 CPU
1005 Interface device
1006 Display device
1007 Input device
1008 Output device

The invention claimed is:

1. A decoding device, comprising:
a memory; and
a processor configured to execute
receiving, through a communication channel or a storage medium, a code word encoded by a polar code from an original message, from an encoding device;
decoding the original message from the code word based on a conditional probability expressed by a symmetric parameterization and having observation information as a condition, the conditional probability expressed by the symmetric parameterization expressing how much a value of a bit to be decoded deviates from ½ so as to reduce a memory space required to store values of the conditional probability; and
outputting the decoded original message,
wherein the original message is transmitted to the decoding device with error correction or data compression.

2. The decoding device according to claim 1, wherein, in a case where the decoding device is applied to decoding for an information source code, the processor further executes,
inputting information of a frozen bit as the code word from the communication channel or the storage medium that is noise-free, and
decoding the original message by using auxiliary information as the observation information.

3. The decoding device according to claim 1, wherein, in a case where the decoding device is applied to decoding for communication channel code, the processor further executes,
inputting, as the code word, a communication channel output from the communication channel having noise, and
decoding the original message by using the communication channel output as the observation information.

4. The decoding device according to claim 3, wherein, in a case where the decoding device is applied to decoding for a systematic communication channel code,
information of a frozen bit is shared between an encoding side and a decoding side, and
the processor further executes inputting the communication channel output in which the original message and additional information obtained by polar conversion on the encoding side are used as communication channel inputs, and
decoding the original message by using the information of the frozen bit and the communication channel output.

5. The decoding device according to claim 3, wherein, in a case where the decoding device is applied to decoding for a non-systematic communication channel code,
information of a frozen bit is shared between an encoding side and a decoding side, and
the processor further executes inputting the communication channel output in which information of non-frozen bit and information obtained by polar conversion from the information of the frozen bit on the encoding side are used as communication channel inputs, and
decoding the original message by storing a determination result of 0 or 1 in a memory area corresponding to a position of a non-frozen bit based on the information of the frozen bit and the communication channel output.

6. The decoding device according to claim 1, wherein the processor further executes list decoding for selecting a sequence of a most probable path from among the number (predetermined list size) of survival paths.

7. The decoding device according to claim 1, wherein the conditional probability is calculated based on a signed difference between a probability to be 0 and a probability to be 1 for each bit.

8. A decoding method executed by a decoding device including a memory and a processor, the method comprising:
receiving, through a communication channel or a storage medium, a code word encoded by a polar code from an original message, from an encoding device;
decoding the original message from the code word based on a conditional probability expressed by a symmetric parameterization and having observation information as a condition, the conditional probability expressed by the symmetric parameterization expressing how much a value of a bit to be decoded deviates from ½ so as to reduce a memory space required to store values of the conditional probability; and
outputting the decoded original message,
wherein the original message is transmitted to the decoding device with error correction or data compression.

9. A non-transitory computer-readable recording medium having computer-readable instructions stored thereon, which when executed, cause a computer to perform a process comprising: receiving, through a communication channel or a storage medium, a code word encoded by a polar code from an original message, from an encoding device;
decoding the original message from the code word based on a conditional probability expressed by a symmetric parameterization and having observation information as a condition, the conditional probability expressed by the symmetric parameterization expressing how much a value of a bit to be decoded deviates from ½ so as to reduce a memory space required to store values of the conditional probability; and
outputting the decoded original message,
wherein the original message is transmitted to the decoding device with error correction or data compression.

* * * * *